US012575184B2

(12) United States Patent
Lilak et al.

(10) Patent No.: US 12,575,184 B2
(45) Date of Patent: Mar. 10, 2026

(54) CMOS ARCHITECTURE WITH THERMALLY STABLE SILICIDE GATE WORKFUNCTION METAL

(71) Applicants: Aaron D. Lilak, Beaverton, OR (US); Orb Acton, Portland, OR (US); Cheng-Ying Huang, Hillsboro, OR (US); Gilbert Dewey, Beaverton, OR (US); Ehren Mannebach, Tigard, OR (US); Anh Phan, Beaverton, OR (US); Willy Rachmady, Beaverton, OR (US); Jack T. Kavalieros, Portland, OR (US)

(72) Inventors: Aaron D. Lilak, Beaverton, OR (US); Orb Acton, Portland, OR (US); Cheng-Ying Huang, Hillsboro, OR (US); Gilbert Dewey, Beaverton, OR (US); Ehren Mannebach, Tigard, OR (US); Anh Phan, Beaverton, OR (US); Willy Rachmady, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 906 days.

(21) Appl. No.: 17/448,382

(22) Filed: Sep. 22, 2021

(65) Prior Publication Data

US 2023/0090092 A1 Mar. 23, 2023

(51) Int. Cl.
H10D 87/00 (2025.01)
H01L 21/28 (2025.01)
(Continued)

(52) U.S. Cl.
CPC ....... H10D 87/00 (2025.01); H01L 21/28097 (2013.01); H10D 62/121 (2025.01);
(Continued)

(58) Field of Classification Search
CPC .. H10D 30/502; H10D 30/503; H10D 30/504; H10D 30/43; H10D 30/47;
(Continued)

(56) References Cited

U.S. PATENT DOCUMENTS 10,468,491 B1 * 11/2019 Clevenger ......... H01L 21/76802
2006/0124974 A1 6/2006 Cabral, Jr. et al.
(Continued)

FOREIGN PATENT DOCUMENTS

CN 105097465 A * 11/2015
CN 113299628 A 8/2021
WO 2019156673 A1 8/2019

OTHER PUBLICATIONS

Partial European Search Report received for EP application No. 22183518.4, dated Dec. 15, 2022. 13 pages.
(Continued)

*Primary Examiner* — Britt Hanley
*Assistant Examiner* — Jason James Greaving
(74) *Attorney, Agent, or Firm* — Arcane Law PLLC

(57) ABSTRACT

An integrated circuit having a transistor architecture includes a first semiconductor body and a second semiconductor body. The first and second semiconductor bodies are arranged vertically (e.g., stacked configuration) or horizontally (e.g., forksheet configuration) with respect to each other, and separated from one another by insulator material, and each can be configured for planar or non-planar transistor topology. A first gate structure is on the first semiconductor body, and includes a first gate electrode and a first high-k gate dielectric. A second gate structure is on the second semiconductor body, and includes a second gate electrode and a second high-k gate dielectric. In an example, the first gate electrode includes a layer comprising a compound of silicon and one or more metals; the second gate
(Continued)

structure may include a silicide workfunction layer, or not. In one example, the first gate electrode is n-type, and the second gate electrode is p-type.

20 Claims, 21 Drawing Sheets

(51) Int. Cl.

| | |
|---|---|
| *H10D 62/10* | (2025.01) |
| *H10D 64/66* | (2025.01) |
| *H10D 86/00* | (2025.01) |
| *H10D 86/01* | (2025.01) |
| *H10D 88/00* | (2025.01) |

(52) U.S. Cl.
CPC ........... *H10D 64/668* (2025.01); *H10D 86/01* (2025.01); *H10D 86/215* (2025.01); *H10D 88/00* (2025.01)

(58) Field of Classification Search
CPC .............. H10D 30/62; H10D 30/6211; H10D 30/6217; H10D 30/6218; H10D 30/6219; H10D 30/6733; H10D 30/6734; H10D 30/6735; H10D 30/6748; H10D 30/6757; H10D 30/67; H10D 30/6704; H01L 25/043; H01L 25/0657; H01L 25/074; H01L 25/0756
See application file for complete search history.

(56) References Cited

U.S. PATENT DOCUMENTS

| | | | |
|---|---|---|---|
| 2009/0039439 A1 | 2/2009 | Ramin et al. | |
| 2011/0108922 A1 | 5/2011 | Liu et al. | |
| 2012/0248545 A1 | 10/2012 | Yugami | |
| 2013/0049092 A1 | 2/2013 | Liang et al. | |
| 2014/0004693 A1 | 1/2014 | Hoon | |
| 2015/0004783 A1* | 1/2015 | Lee .................... | H10D 84/0177 |
| | | | 438/653 |
| 2016/0276160 A1 | 9/2016 | Ching et al. | |
| 2019/0067441 A1* | 2/2019 | Yang ...................... | H10D 30/43 |
| 2020/0243522 A1 | 7/2020 | Cheng et al. | |
| 2020/0343343 A1 | 10/2020 | Acton et al. | |
| 2021/0183711 A1 | 6/2021 | Dentoni Litta et al. | |
| 2021/0193821 A1 | 6/2021 | Dentoni Litta et al. | |
| 2021/0210489 A1 | 7/2021 | Zhang et al. | |
| 2021/0265496 A1* | 8/2021 | Chu .................. | H10D 30/6757 |
| 2021/0358891 A1* | 11/2021 | Chuang .................. | H01L 25/18 |
| 2021/0375698 A1* | 12/2021 | Cheng ................ | H10D 84/0177 |
| 2022/0336456 A1* | 10/2022 | Hong .................. | H10D 84/038 |
| 2022/0344360 A1* | 10/2022 | Cheng .................... | H01L 25/18 |

OTHER PUBLICATIONS

International Search Report and Written Opinion received for PCT/US2018/017411. Mail Date: Nov. 14, 2018. 13 pages.
International Preliminary Report on Patentability received for PCT/US2018/017411. Mail Date: Aug. 20, 2020. 10 pages.
Extended European Search Report received for EP application No. 22183518.4, dated Mar. 20, 2023. 12 pages.

* cited by examiner

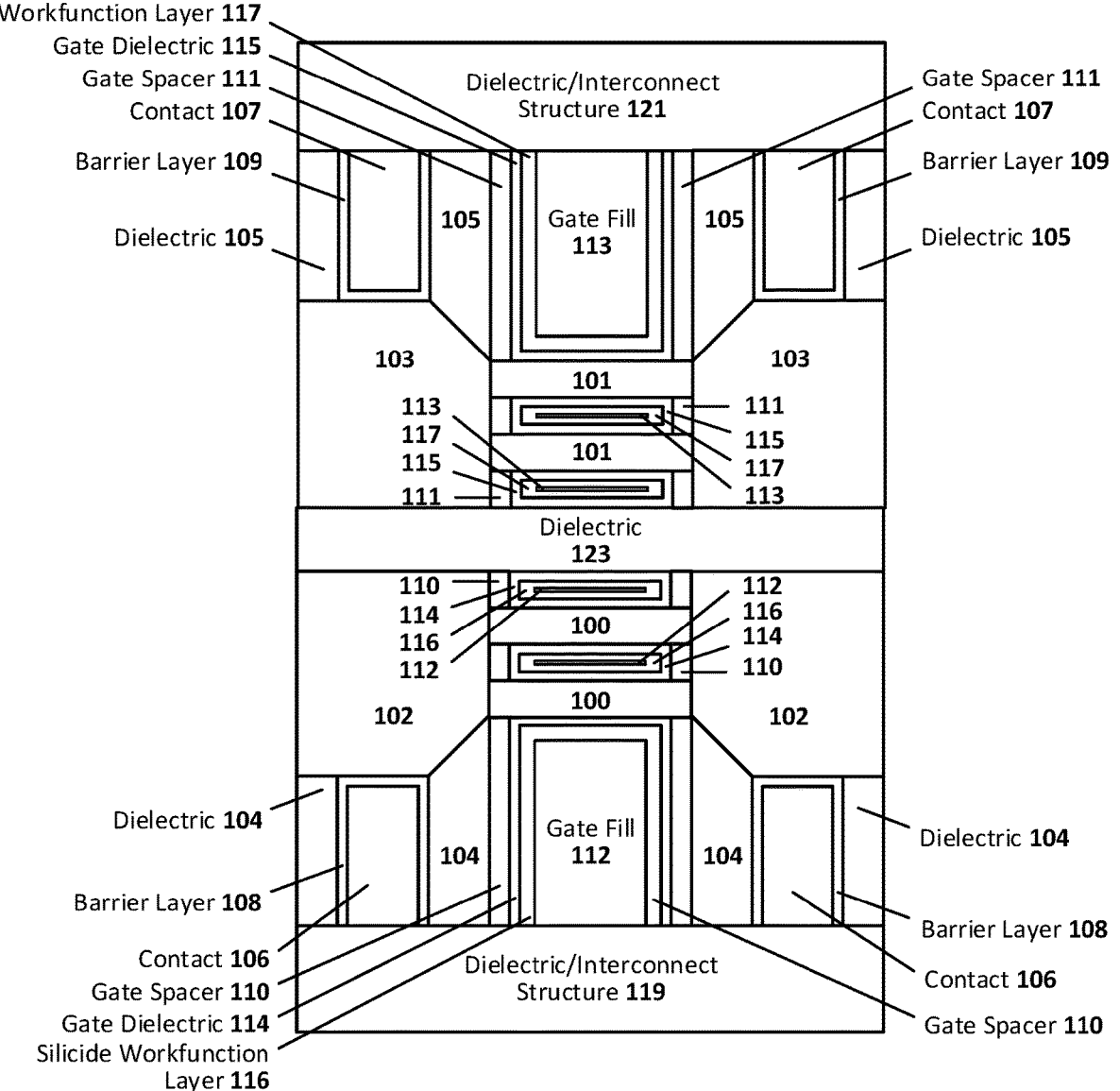

Workfunction Layer 117
Gate Dielectric 115
Gate Spacer 111
Contact 107
Barrier Layer 109
Dielectric 105

Dielectric/Interconnect Structure 121

Gate Spacer 111
Contact 107
Barrier Layer 109
Dielectric 105

105     Gate Fill 113     105

103     101     103

113     111
117     115
115     101     117
111     113

Dielectric 123

110     112
114     116
116     100     114
112     110

102     100     102

Dielectric 104

104     Gate Fill 112     104

Dielectric 104

Barrier Layer 108

Contact 106
Gate Spacer 110
Gate Dielectric 114
Silicide Workfunction Layer 116

Dielectric/Interconnect Structure 119

Barrier Layer 108
Contact 106
Gate Spacer 110

Fig. 1c

CMOS ARCHITECTURE WITH THERMALLY STABLE SILICIDE GATE WORKFUNCTION METAL

FIELD OF THE DISCLOSURE

The present disclosure relates to integrated circuits, and more particularly, to transistors.

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the z-dimension (build upwards rather than laterally outwards in the x- and y-dimensions). Some such 3D integrated circuits are formed utilizing a technique known as layer transfer. Such layer transfer may include, for instance, bond and hydrogen-based or hydrogen/helium based cleave techniques. Other 3D integrated circuits are formed by separately forming transistors on two distinct wafers (sometimes referred to as host and donor wafers or substrates) and then bonding those two wafers together via an oxide bonding layer, followed by chemical-mechanical polish (CMP) operations to remove excess wafer. Still other 3D integrated circuits are achieved by forming transistors on upper and lower regions of the same fin structure. In any such cases, such 3D integration schemes provide a stacked transistor architecture and give rise to a number of non-trivial issues.

BRIEF DESCRIPTION OF THE DRAWINGS

FIGS. 1*a*-1*f* are cross-sectional views that illustrate example integrated circuits configured with a stacked transistor architecture that includes a lower gate structure having a silicide workfunction layer, in accordance with an embodiment of the present disclosure.

DETAILED DESCRIPTION

Figure 1A:
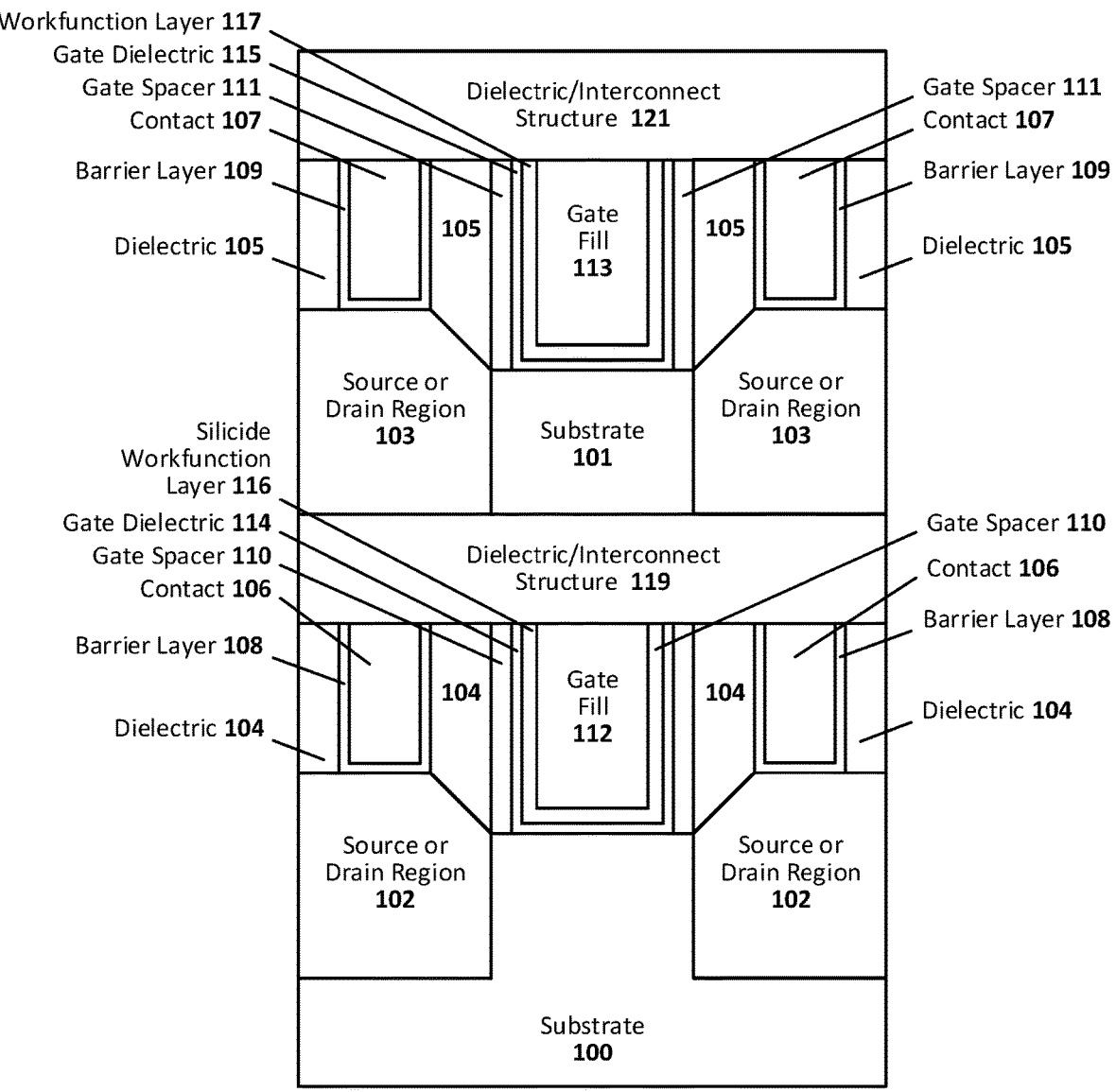

Techniques are provided herein to form temperature-stable gate structures for the lower transistor layer in stacked transistor architecture, such that the workfunction of the lower gate structures can withstand processing temperatures attributable to formation of the upper transistor layer. The techniques may also be applied to forksheet transistor topologies, where an n-type transistor device extends laterally from one side of a dielectric wall and a p-type transistor device extends laterally from the other side of the dielectric wall. In an embodiment, an integrated circuit includes a first semiconductor body and a second semiconductor body. The first and second semiconductor bodies are separated from one another by insulator material, and each can be configured for planar or non-planar transistor topology (e.g., a mesa for planar, or a fin or one or more nanowires or ribbons or a forksheet for non-planar). A first gate structure is on the first semiconductor body, and includes a first gate electrode and a first high-k gate dielectric between the first gate electrode and the first semiconductor body. The first gate electrode includes a layer comprising a compound of silicon and one or more metals, which can be a silicide workfunction layer such as an n-type workfunction layer. A second gate structure is on the second semiconductor body, and includes a second gate electrode and a second high-k gate dielectric between the second gate electrode and the second semiconductor body. The second gate structure may also include a silicide workfunction layer, such as a p-type workfunction layer, but it need not; for instance, in some cases, the second gate structure includes a p-type workfunction layer that is silicide-free. In some cases, the first gate electrode is an NMOS gate electrode of a lower transistor, and the second gate electrode is a PMOS gate electrode of an upper transistor, the lower and upper transistors arranged in a stacked CMOS circuit. Numerous variations and embodiments will be apparent in light of this disclosure.

General Overview

As previously noted above, there remain a number of non-trivial challenges with respect to stacked transistor architecture. In more detail, to make an integrated circuit configured with a stacked transistor architecture, the lower transistor layer needs to survive the process temperature range of the upper transistor layer without degrading the transistor performance. For instance, consider the example case having complementary metal oxide semiconductor (CMOS) integrated circuitry, where high temperature processing utilized during formation of an upper transistor layer that includes p-type metal oxide semiconductor (PMOS) transistors can cause a shift in the threshold voltage ($V_t$) of n-type metal oxide semiconductor (NMOS) transistors previously formed in the lower transistor layer. The is particularly true when the lower NMOS transistors include temperature-sensitive gate workfunction metal such as aluminum, because aluminum tends to migrate or diffuse at high temperature. Example such aluminum-containing NMOS gate workfunction metals include, for instance, titanium aluminum carbide and titanium aluminum nitride. A possible solution to this issue is to relegate PMOS devices to the lower transistor layer, and keep NMOS devices in the upper transistor layer so as to avoid exposure to the PMOS processing temperatures. Such an arrangement works, as the gate workfunction metal of PMOS transistors is less susceptible to temperature-induced migration. Example such PMOS gate workfunction metals include, for instance, titanium nitride and tungsten (e.g., no aluminum). However, not being able to populate NMOS devices in the lower transistor layer limits design flexibility. For instance, stacked transistor architecture having upper CMOS and lower CMOS, or upper PMOS and lower NMOS, would be susceptible to $V_t$ instability. Thus, temperature stable gate workfunction schemes are needed for stacked transistor architecture or so-called 3D CMOS.

Thus, and in accordance with an embodiment of the present disclosure, techniques are provided herein to form silicide workfunction metal for gate structures in 3D CMOS and other transistor architectures. Although the techniques can be used in any number of transistor configurations, they are particularly useful to implement a stacked transistor architecture having NMOS transistors in the lower device layer and PMOS transistors in the upper device layer, wherein the final gate structures of the lower NMOS transistors are subjected to the source and drain processing temperatures of the upper PMOS transistors. The techniques can be used with planar and non-planar transistor topologies (e.g., finFETs, nanowire transistors, nanoribbon transistors, or forksheet transistors), and with gate-first or gate-last processing. Numerous embodiments and variations will be appreciated in light of this disclosure.

One example provides an integrated circuit that includes a first semiconductor body and a second semiconductor body above the first semiconductor body. The first and second semiconductor bodies are separated from one another by insulator material, and each can be, for example, a fin, or one or more nanowires or ribbons, or a forksheet for non-planar stacked transistors. A first gate structure is on the first semiconductor body, and includes a first gate electrode and a first high-k gate dielectric between the first gate electrode and the first semiconductor body. The first gate electrode includes a layer comprising a compound of silicon and one or more metals. This layer can be a silicide workfunction layer, such as an n-type workfunction layer. Note in this example case that this workfunction layer is in the lower device region of the stacked transistor architecture, and thus will be subjected to processing temperatures of the upper device region of the stacked transistor architecture. This exposure is okay, however, as the silicide workfunction layer is temperature-stable. A second gate structure is on the second semiconductor body, and includes a second gate electrode and a second high-k gate dielectric between the second gate electrode and the second semiconductor body. The second gate structure may also include a silicide workfunction layer, such as a p-type workfunction layer. In some other embodiments, the second gate structure includes a p-type workfunction layer that is silicide-free. In some cases, the first gate electrode is an NMOS gate electrode of a first transistor, and the second gate electrode is a PMOS gate electrode of a second transistor, the first and second transistors arranged in a stacked CMOS circuit.

In some examples, the one or more metals of the compound are one or more first metals, and the first gate electrode further includes one or more second metals. The one or more second metals can be, for instance, gate fill metal deposited to fill any remaining voids in the first gate structure after the silicide workfunction layer is provided. For instance, in some cases, at least a portion of the one or more second metals is between first and second portions of the compound. The top surface of gate fill metal may be coplanar with the top surface of the silicide workfunction layer, but in some cases, the silicide workfunction layer is recessed, such that the top surface of gate fill metal is above or otherwise higher than the top surface of the silicide workfunction layer. Although the metals can vary from one embodiment to the next, in one example case the one or more first metals include titanium or tantalum (so as to provide a titanium silicide or a tantalum silicide for the workfunction layer), and the one or more second metals for the gate fill include cobalt or tungsten. In other embodiments, the compound of the silicide workfunction layer is a bi-metallic silicide that includes a combination of two metals. For example, in some embodiments, the compound includes a first metal and a second metal which is of a different metal type than that of the first metal (such as the case where the first and second metals are from different groups of the periodic table). One such example is where the compound includes silicon and both titanium and tantalum. The thickness of the metal silicide workfunction layer can vary as well, but in some example embodiments is in the range of 20 to 100 angstroms.

In some embodiments, the layer comprising the compound of the first gate electrode is a first layer, and the first gate electrode further includes a second layer having first and second non-contiguous portions. This second layer can be a nucleation layer adjacent sidewalls of the gate trench, but not adjacent the bottom of the gate trench. In this manner, the first non-contiguous portion is between the gate electrode and a first portion of the high-k gate dielectric, and the second non-contiguous portion is between the gate electrode and a second portion of the high-k gate dielectric, and wherein the second layer is not between the gate electrode and a third portion of the high-k gate dielectric. This nucleation layer can be, for instance, a layer of titanium nitride that has a thickness in the range of 2 to 10 angstroms. In some embodiments, this nucleation layer is used to reduce oxidation of the silicon in the later-deposited silicon-containing layer.

As previously explained, the first and second semiconductor bodies can be configured with planar or non-planar channel regions. Example non-planar channel regions include, for instance: nanowire or nanoribbon channel regions that have a gate-all-around configuration; or fin-based channel regions that can be gated on two or three sides so as to provide double-gate and tri-gate configurations respectively; or forksheet configurations having a tri-gate forked structure that has a vertically extending dielectric wall between laterally extending PMOS and NMOS devices. In one such example, the first semiconductor body includes a first nanoribbon, and the first gate structure wraps around the nanoribbon, and wherein the second semiconductor body includes a second nanoribbon, and the second gate structure wraps around the second nanoribbon. A given channel region can include a number of nanoribbons or wires. Note that, in some embodiments having multiple nanoribbons, the silicide workfunction layer may merge between two neighboring NMOS nanoribbons, such that there is no gate fill metal between those two NMOS nanoribbons; other embodiments may have gate fill metal between the two NMOS nanoribbons as well. In any such gate-all-around cases, the given gate structure is still considered to wrap around the nanoribbons because at least the gate dielectric and silicide workfunction layer do wrap around the nanoribbons, regardless of whether the gate fill metal does. In a similar fashion, the silicide workfunction layer of forksheet configuration may merge between two neighboring NMOS nanosheets extending laterally from the dielectric wall that separates the PMOS and NMOS devices, such that there is no gate fill metal between those two laterally extending NMOS nanosheets; other forksheet configurations may have gate fill metal between the NMOS laterally extending nanosheets as well. Further note that a given vertically stacked architecture may include a combination of channel region types. For instance, in one example, the lower channel region can be a fin portion of a fin structure and the upper channel region can include one or more nanoribbons or nanowires included in a fin structure.

In some embodiments, a first source region and a first drain region are each adjacent to the first semiconductor body, and a second source region and a second drain region are each adjacent to the second semiconductor body. In some such cases, the first source and drain regions comprise an n-type dopant, and the second source and drain regions comprise a p-type dopant. The source and drain regions can be epitaxial source or drain regions that are formed by etching away portions of the corresponding semiconductor body and depositing a desired source/drain material in its place. In one example case, the first source and drain regions comprise phosphorus-doped silicon, and the second source and drain regions comprise boron-doped silicon germanium (SiGe).

There are a number of benefits of the techniques provided herein. For instance, a silicide workfunction metal has better thermal stability, relative to a traditional aluminum-containing workfunction metal. Such silicide workfunction metals can be used to enable the formation of final NMOS gate structures in the lower transistor layer of a 3-D CMOS, prior to forming PMOS source and drain regions in the upper transistor layer, according to some example embodiments. In addition, silicide workfunction metal has a lower threshold voltage $V_t$ relative to traditional workfunction metals such as titanium aluminum carbide and titanium nitride. Lower $V_t$ increases on-state current at the given gate voltage, which is desirable, according to some embodiments. In addition, silicide workfunction metal has lower metal resistance relative to traditional workfunction metals such as titanium aluminum carbide and titanium nitride, which reduces resistive-capacitive (RC) delay and improves switching speed, according to some embodiments. Moreover, the workfunction of a metal silicide layer changes less than a titanium aluminum carbide layer, as layer thickness changes. This means that a silicide workfunction metal layer according to an embodiment is more scalable than a titanium aluminum carbide layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that a "compound" as used herein may in some cases refer to a material that includes multiple phases and/or bonding configurations in the same chunk or blob of that material. For instance, in a blob of a silicide compound (e.g., a compound of silicon and one or more metals, such as a silicide workfunction metal, as variously provided herein), there may be one or more regions with one phase or bonding configuration and another one or more regions a small distance away with another phase or bonding configuration. For example, a compound of titanium and silicon (TiSi) may include a first portion having one or more silicide phases of TiSi, $TiSi_2$, $Ti_3Si$, $Ti_5Si_3$, $Ti_5Si_4$, and a second portion having one or more such silicide phases but different from the first portion. Note that stoichiometric and/or non-stoichiometric phases may be present. In another example, a compound of silicon, titanium and tantalum may include a first portion having a first phase of titanium silicide, and a second portion having a second phase of tantalum silicide. In such cases, the titanium and tantalum may interact with the silicon independently of each other, such that there are phases of titanium silicide and phases of tantalum silicide but no ternary phases that include each of titanium, tantalum and silicon. The terms intermetallic, intermetallic compound, alloy, and intermetallic alloy may also be used to refer to such materials that include silicon and one or more metals, and may be used interchangeably with compound.

Architecture

Figure 1B:
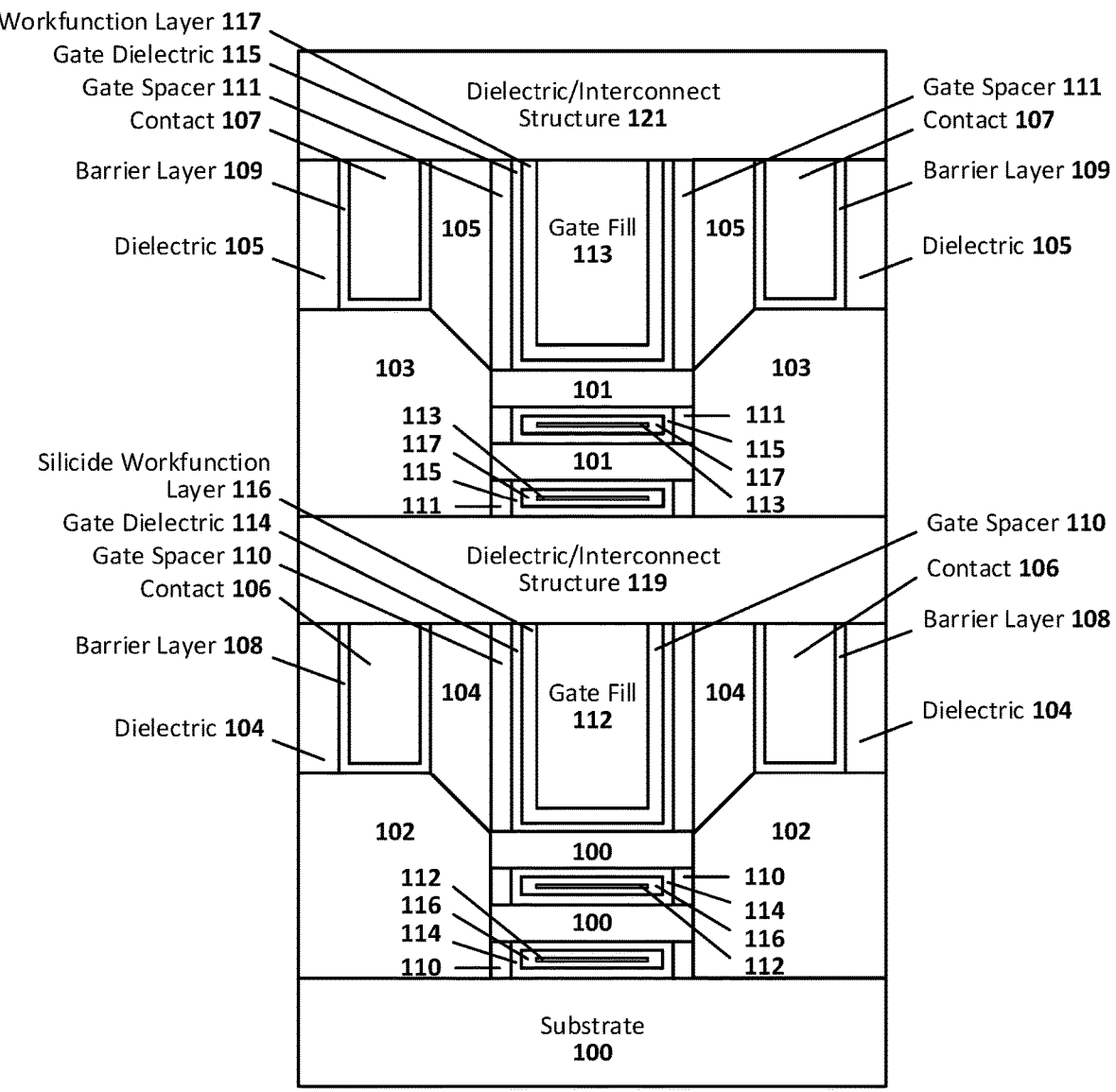
Figure 1D:
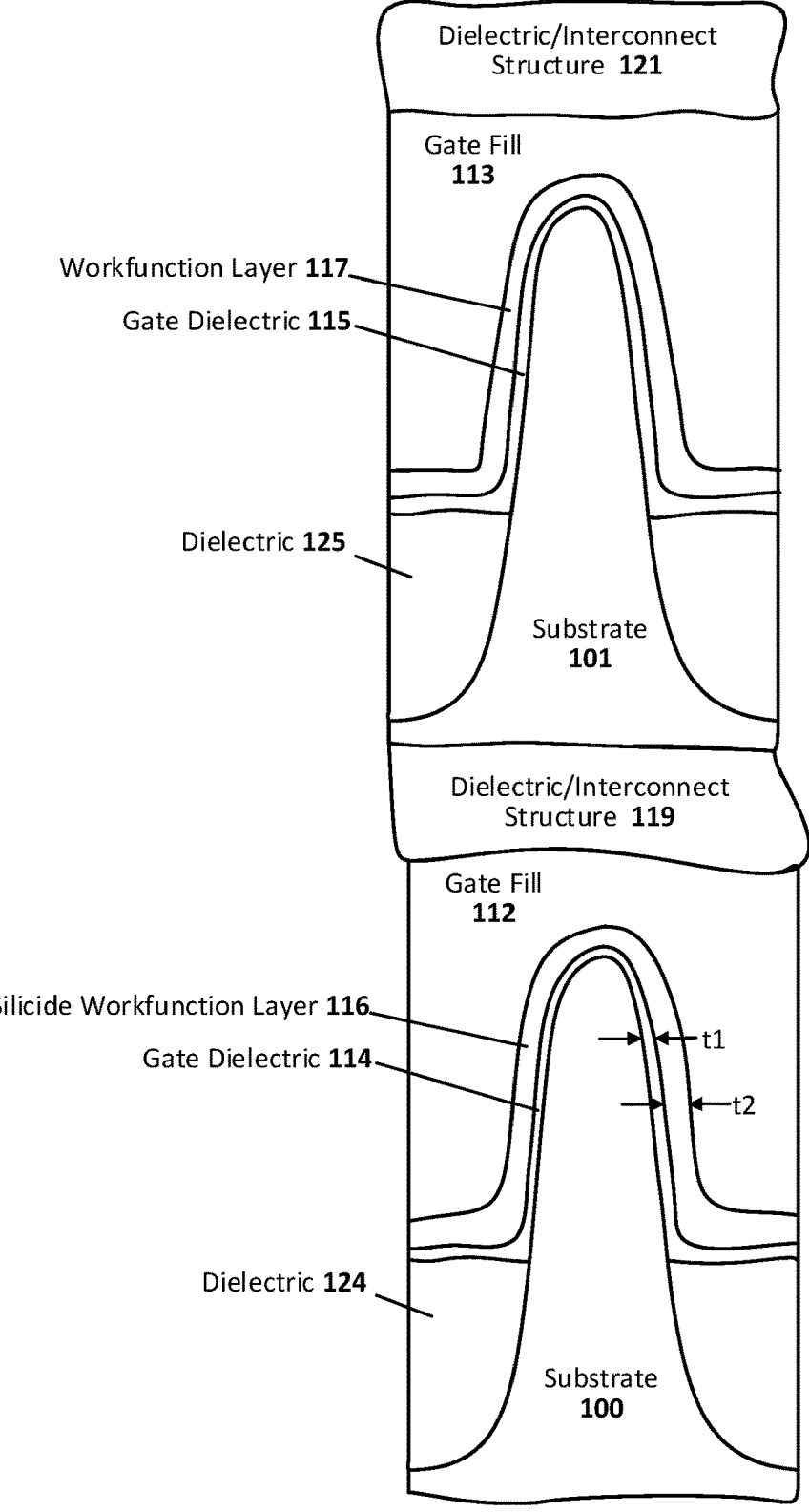
Figure 1E:
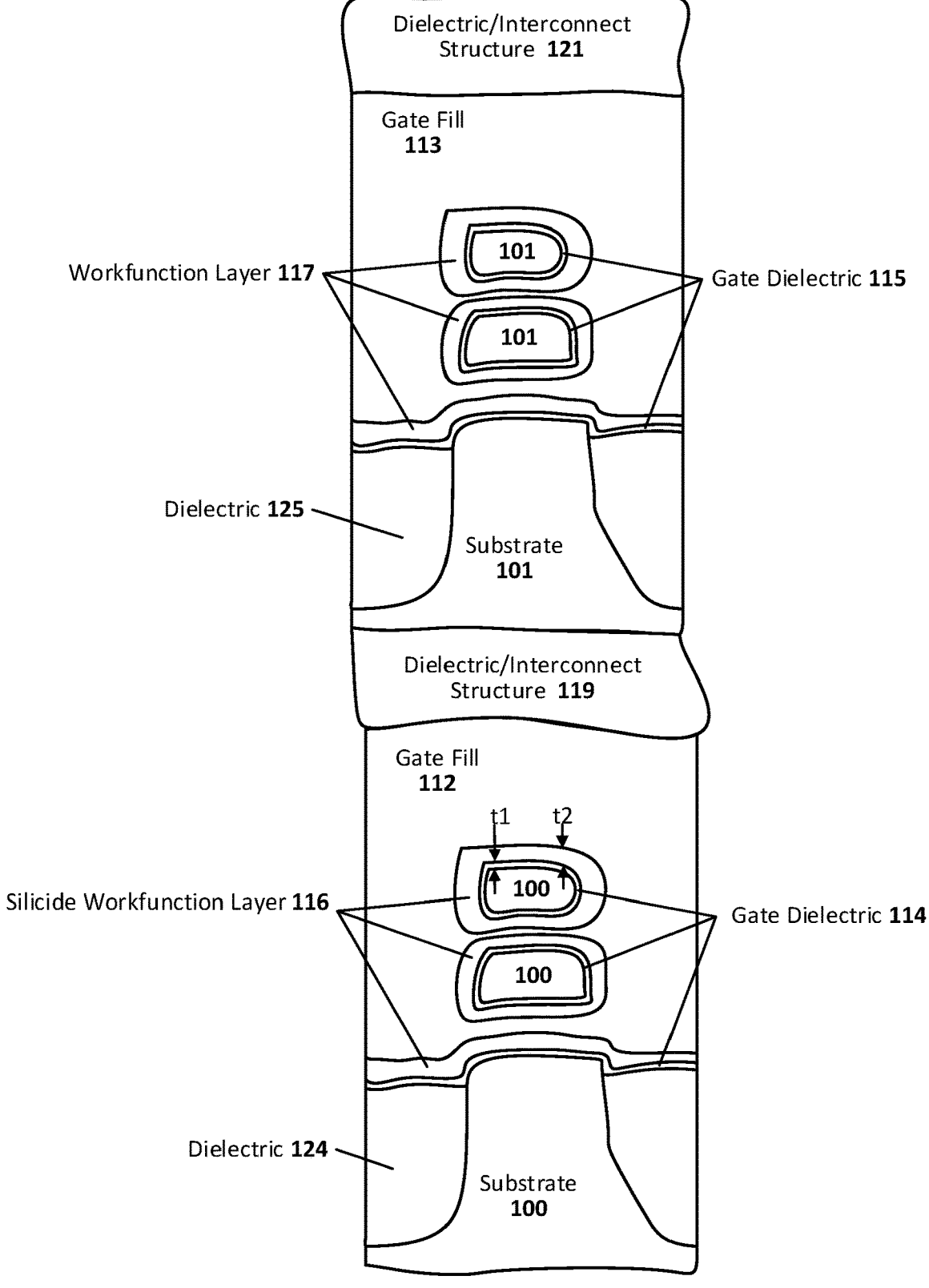
Figure 1F:
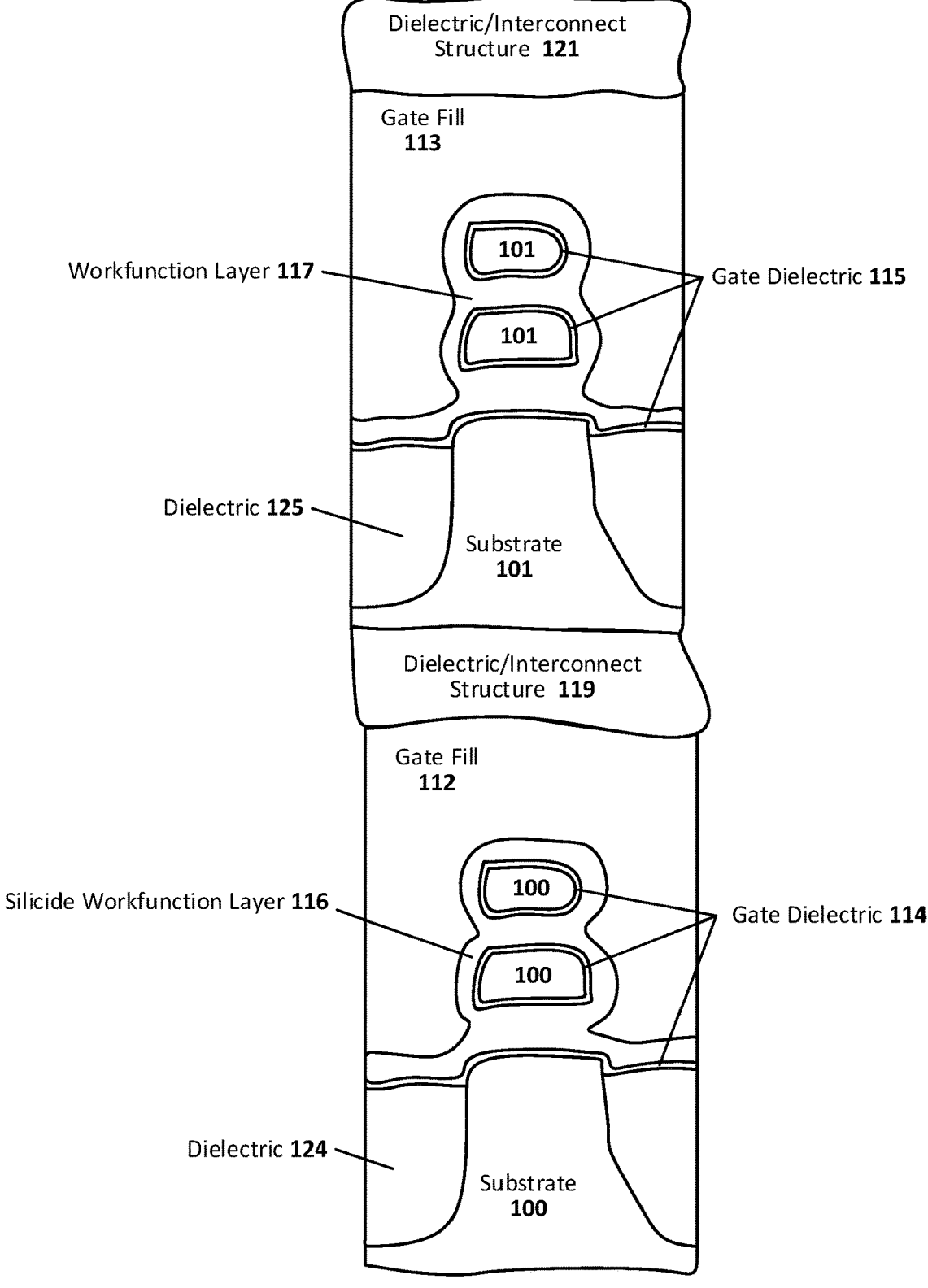

FIGS. 1a-1f are cross-sectional views that illustrate example integrated circuits configured with a stacked transistor architecture that includes a lower gate structure having a silicide workfunction layer, in accordance with an embodiment of the present disclosure. The stacked transistor architecture includes upper devices and lower devices, formed on separate fin structures or other semiconductor bodies. As can be seen in FIG. 1a, the cross-section is taken through the channel, source, and drain regions (perpendicular to the gate structures). This particular cross-section includes one channel region along with a source region and a drain region for each of the lower and upper device layers, but any number of channel regions and corresponding source and drain regions can be included in each device layer, as will be appreciated. Further note that not all transistors in a given layer need to be contacted (e.g., some examples may include dummy devices or devices that are not connected into the overall circuit). The semiconductor bodies 100 and 101 included in the channel regions of the lower and upper transistors, respectively, can vary in form. For instance, in the example embodiment of FIG. 1a, the semiconductor bodies 100 and 101 are in the form of either mesas (for planar configurations) or fins (for non-planar configurations), since the cross-section for such configurations looks similar with respect to this orientation. In the example embodiments of FIGS. 1b-c, the semiconductor bodies 100 and 101 are in the form of nanoribbons. FIGS. 1d-f each shows another cross-section view, taken parallel to and through the gate structures, to show further details associated with fin-based channel regions (1d) and nanoribbon channel regions (1e-f), and will be discussed in turn. In these examples, the lower channel region includes a set of two nanoribbons 100, and the upper channel region includes a set of two nanoribbons 101. Other examples may include fewer nanoribbons per channel region, or more. Still other embodiments may include other channel configurations, such as one or more nanowires or other semiconductor body. To this end, the present disclosure is not intended to be limited to any particular channel configuration or topology; rather the techniques provided herein can be used in any stacked transistor architecture, such as cases where an n-type temperature-stable gate workfunction layer is desirable.

With further reference to FIG. 1a, the lower device region includes source and drain regions 102, each adjacent to a gated channel region. As can be further seen in this example cross-section, the lower gate structure is on semiconductor body 100, and includes a gate spacer 110, gate fill 112, gate dielectric 114, and silicide workfunction layer 116. Dielectric layer 104 is to either side of the gate structure. Contacts 106 are formed in dielectric 104 over source and drain regions 102. In this example case, a barrier layer 108 is provided between dielectric 104 and contacts 106. Dielectric structure 119 provides isolation between the lower and upper transistors, and may further include frontside interconnects to contacts 106 and to the lower gate electrode.

As can be further seen in FIG. 1a, the upper device region includes source and drain regions 103, each adjacent to a gated channel region. As can be further seen in this example cross-section, the upper gate structure is on semiconductor body 101, and includes a gate spacer 111, gate fill 113, gate dielectric 115, and silicide workfunction layer 117. Dielectric layer 105 is to either side of the gate structure. Contacts 107 are formed in dielectric 105 over source and drain regions 103. In this example case, a barrier layer 109 is provided between dielectric 105 and contacts 107. Dielectric structure 121 may include frontside interconnects to contacts 107 and the upper gate electrode.

Each of the lower and upper gate structures can be formed via gate-first or gate-last processing, and may include any number of suitable gate materials and configurations. In some embodiments, the lower final gate structure is formed before the upper source and drain regions 102 are formed, meaning that the lower final gate structure will be subjected to the temperatures associated with forming the upper source and drain regions 103. The gate spacers 110 and 111 may be, for example, silicon nitride or silicon dioxide or a carbon-doped oxide or an oxynitride or a carbon-doped oxynitride. The gate dielectrics 114 and 115 may be any suitable gate dielectric material(s), such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some example embodiments, an annealing process may be carried out to improve gate dielectric quality when a high-k material is used. In some embodiments, the gate dielectrics include a multilayer structure of two or more material layers or components. For instance, in one such embodiment, the upper and/or lower gate dielectrics can be a bi-layer structure having a first dielectric material (e.g., silicon dioxide) in contact with the corresponding channel region 100 or 101 and a second high-k dielectric material (e.g., hafnium oxide) in contact with the first dielectric material. Further, gate fill 112 and 113 may comprise a wide range of suitable metals or metal alloys, such as tungsten, cobalt, molybdenum, ruthenium, titanium, or tantalum. In some example embodiments, the gate dielectrics 114 and 115 and/or gate fills 112 and 113 may include concentration grading (increasing or decreasing) of one or more materials therein.

The workfunction layers 116 and 117 can be considered part of the gate electrodes, along with the gate fill 112 and 113. The make-up of the workfunction layers 116 and 117 can vary from one embodiment to the next, but in some embodiments, workfunction layer 116 is a silicide work-function layer, and workfunction layer 117 is silicide-free, which is a particularly useful configuration for stacked CMOS transistor architecture having NMOS transistors in the lower device region and PMOS transistors in the upper device region (or both NMOS and PMOS transistors in the lower device region), particularly when the final gate structures of that lower device region will be subjected to the temperature burden associated with subsequent source/drain 103 processing. In such an example case, silicide workfunc-tion layer 116 includes a compound of silicon and one or more metals, so as to provide an n-type silicide workfunc-tion layer. In other embodiments, the compound of silicide workfunction layer 116 is a bi-metallic silicide that includes a combination of metals. For example, in some embodi-ments, the compound includes a first metal and a second metal which is of a different metal type than that of the first metal (such as the case where the first and second metals are from different groups of the periodic table). One such example is where the compound includes silicon and both titanium and tantalum. In some example cases, the com-pound may include multiple bond configurations and/or phases, such as a first phase that include silicon and the first metal but not the second metal (e.g., titanium silicide), and a second phase that includes silicon and the second metal but not the first metal (e.g., tantalum silicide). Further details of the silicide workfunction layer 116 will be provided in turn. Workfunction layer 117 can be, for example, a p-type workfunction layer, such as titanium nitride.

Further note that, in this example embodiment, silicide workfunction layer 116 extends to the top of the lower gate structure. In this sense, workfunction layer 116 has a top surface that is coplanar with the top surface of gate fill 112. In other embodiments, silicide workfunction layer 116 is recessed, such that a portion of gate fill 112 is not between portions of workfunction layer 116. One such example case is shown in the cross-section of FIGS. 8 through 12, where an upper portion of gate fill 112 is on, or adjacent to, gate dielectric 114, with no silicide workfunction layer 116 therebetween.

In some embodiments, the lower gate electrode may further include a nucleation layer between the gate dielectric 114 and the silicide workfunction layer 116. In one such embodiment, a nucleation layer is provided adjacent side-walls of the gate trench (sandwiched between gate dielectric 114 and silicide workfunction layer 116), but not adjacent the bottom of the gate trench (so silicide workfunction layer 116 is on that portion of gate dielectric 114). In this manner, a first non-contiguous portion of nucleation layer is between the silicide workfunction layer 116 and a first portion of gate dielectric 114, and the second non-contiguous portion of nucleation layer is between the silicide workfunction layer 116 and a second portion of gate dielectric 114. This nucleation layer can be, for instance, a layer of titanium nitride that has a thickness in the range of 2 to 10 angstroms. In some such embodiments, this nucleation layer is used to reduce oxidation of the later-deposited silicon-containing used to make silicide workfunction layer 116.

Further note that the gate structures of the upper devices may be the same as the gate structures of the lower devices, or different. In some example embodiments, for instance, the gate dielectrics 114 and 115 are the same, but the lower gate electrode includes a silicide workfunction layer 116 suitable for NMOS devices (e.g., titanium silicide, or titanium tan-talum silicide), while the gate electrodes of the upper gate structures include a workfunction layer 117 suitable for PMOS devices (e.g., titanium nitride). Likewise, the gate dielectric of the upper gate structures may be composition-ally different from the gate dielectric of the lower gate structures. In addition, or alternatively, the gate dielectric of the upper gate structures may have a first thickness, while the gate dielectric of the lower gate structures has a second thickness that is different from the first thickness. For instance, the relatively thicker gate dielectric may be used for a high voltage transistor device, while the relatively thinner gate dielectric may be used for a logic transistor device. Numerous gate structure configurations can be used along with the techniques provided herein, and the present disclosure is not intended to be limited to any particular such configurations.

Likewise, numerous source and drain configurations can be used, and the present disclosure is not intended to be limited to any particular ones. In some example embodiments, the source and drain regions 102 and 103 are epitaxial source and drain regions that are provided after the relevant portion of the corresponding fin or fin structure was isolated and etched away or otherwise removed. In other embodiments, the source and drain regions 102 and 103 may be doped portions of the corresponding fin structure or substrate, rather than epi regions. In some embodiments using an etch and replace process, the epi source and drain regions 102 and 103 are faceted and overgrown from a trench within insulator material (e.g., shallow trench isolation, or gate spacer 110 and 111 that deposits on the sides of the corresponding fin structure in the source and drain locations), and the corresponding source or drain contact structure (108 and 106 for lower contact structures, or 109 and 107 for upper contact structures) lands on that faceted portion. Alternatively, in other embodiments, the faceted portion of epi source and drain regions can be removed (e.g., via chemical mechanical planarization, or CMP), and the corresponding source or drain contact structure lands on that planarized portion.

The source and drain regions 102 and 103 can be any suitable semiconductor material and may include any dopant scheme. For instance, upper source and drain regions 103 may be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Lower source and drain regions 102 can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, upper source and drain regions 103 are boron-doped SiGe, and lower source and drain regions 102 are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In some cases having cap and body structures, the cap structure and body structure may have substantially different dopant concentrations. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used.

The semiconductor bodies 100 and 101, which in this case are mesas or fins, can be any number of semiconductor materials as well, such as group IV material (e.g., silicon, germanium, SiGe, germanium tin, or silicon germanium tin) or group III-V materials (e.g., indium gallium arsenide). The semiconductor bodies 100 and 101 may be lightly doped, or undoped, and may be shaped or sculpted during the gate formation process, according to some embodiments. In some cases, semiconductor bodies 100 and 101 may be a multilayer structure, such as a SiGe body cladded with germanium, or a silicon body cladded with SiGe. Any number of channel configurations can be used.

The contact structures can have any number of configurations. In the example shown, the contact structures include a contact (106 and 107) and a conductive liner or barrier layer (108 and 109), deposited in a contact trench formed in an insulator layer (e.g., dielectric layers 104 and 105, such as silicon dioxide) over the source and drain regions (102 and 103). The liner or barrier layer (108 and 109) can be, for example, tantalum or tantalum nitride, and metal contact (106 and 107) can be any suitable plug/core material, such as tungsten, aluminum, ruthenium, molybdenum, cobalt, titanium, copper, or alloys thereof. In some cases, the contact structures can be optimized p-type and n-type similar to p-type and n-type gate electrodes. For instance, according to some such embodiments, the liner or barrier layer (108 and 109) can be titanium for NMOS source/drain contacts 106, or nickel or platinum for PMOS source/drain contacts 107. In still other embodiments, the contact structures may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of suitable source/drain contact structures can be used in accordance with an embodiment of the present disclosure, as will be appreciated.

Each of dielectric structures 119 and 121 may include dielectric material (e.g., silicon dioxide) and metal interconnect features such as vias and conductive runs so as to provide signal routing and contact to the underlying contact and gate structures. In some example cases, the lower contact and/or gate structures are connected to the upper contact and/or gate structures, such as sometimes done with CMOS circuitry. While frontside contacting is used in this example case, other embodiments may also or alternatively include backside contacting. In one such case, the lower portion of substrate 100 can be removed and replaced with a dielectric layer, and contact and interconnect features can be formed therein, to provide a backside contact scheme.

FIG. 1b shows an example that is similar to the example of FIG. 1a, except that the semiconductor bodies 100 and 101 are in the form of nanoribbons, rather than fins or mesas. The previous relevant discussion is equally applicable here. As can be further seen in this example of FIG. 1b, the lower gate structure wraps around each of the nanoribbons 100 in the lower channel region, and the upper gate structure wraps around each of the nanoribbons 101 in the upper channel region. Lower gate spacer 110 isolates the lower gate structure from contacting source and drain regions 102, and upper gate spacer 111 isolates the upper gate structure from contacting source and drain regions 103. In other embodiments, there may be other insulator layers (e.g., interlayer dielectric) that prevent such contact, whether in addition to the gate spacer, or in place of gate spacer. Note that gate dielectrics 114 and 115 deposit on all surfaces within the respective gate trenches. Further note that the workfunction layer 116 and may consume most even all of the remaining lower gate trench space, such that there is less gate fill 112 than workfunction material, or no gate fill 112, in some embodiments. Likewise, note that the workfunction layer 117 and may consume most even all of the remaining upper gate trench space, such that there is less gate fill 113 than workfunction material, or no gate fill 113, in some embodiments.

FIG. 1c shows an example that is similar to the example of FIG. 1b, except that the lower device region is inverted so as to facilitate backside contact processing, in accordance with an embodiment. The previous relevant discussion is equally applicable here. As can be further seen in this example of FIG. 1c, the upper device region is bonded to the lower device regions by a dielectric layer 123 (e.g., silicon dioxide or other bonding insulator). One or more interconnect feature may be included in dielectric layer 123 so as to facilitate interconnect between the lower and upper device region. In this example configuration, dielectric structure 119 may include backside interconnects to contacts 106 and to the lower gate electrode. Any number of interconnects schemes can be used.

As previously noted, FIGS. 1d-f each shows another cross-section view, taken parallel to and through the gate structures, to show further details associated with fin-based channel regions (FIG. 1d) and nanoribbon channel regions (FIGS. 1e-f), according to some embodiments. Note that these figures are not drawn to scale, but are drawn to reflect real world processing, including the tapered nature of the fins and nanowires, as well as the various rounded corners.

As can be seen in FIG. 1d, the lower fin structure 100 is adjacent dielectric material 124, and the lower gate electrode is on an upper portion of the lower fin structure 100 and includes gate dielectric layer 114, silicide workfunction layer 116, and gate fill 112. Gate dielectric has a thickness of t1, and silicide workfunction layer 116 has a thickness of t2. In one example embodiment, t1 is in the range of several monolayers to 10 nm (e.g., such as 1 to 4 nm), and t2 is in the range of 1 to 20 nm (e.g., such as 2 to 10 nm). Note that in some cases, the silicide workfunction layer 116 may consume a majority of the lower gate trench (more so than gate fill 112); in other embodiments, gate fill 112 may be the majority material within the lower gate trench. As can be further seen in FIG. 1d, the upper fin structure 101 is adjacent dielectric material 125, and the upper gate electrode is on an upper portion of the upper fin structure 101 and includes gate dielectric layer 115, workfunction layer 117, and gate fill 113. The previous relevant discussion is equally applicable here.

As can be seen in FIG. 1e, the lower nanoribbons 100 have been released from a fin structure, and the underlying fin stub is adjacent dielectric material 124 (other embodiments may not include a fin stub). The lower gate electrode wraps around each nanoribbon 100 and includes gate dielectric layer 114, silicide workfunction layer 116, and gate fill 112. Again, gate dielectric has a thickness of t1, and silicide workfunction layer 116 has a thickness of t2, as previously explained with respect to the example embodiment of FIG. 1d. As can be further seen in FIG. 1e, the upper nanoribbons 101 have been released from a fin structure, and the underlying fin stub is adjacent dielectric material 125 (other embodiments may not include a fin stub). The upper gate electrode wraps around each nanoribbon 101 and includes gate dielectric layer 115, workfunction layer 117, and gate fill 113. The previous relevant discussion is equally applicable here.

FIG. 1f shows an example embodiment similar to that of FIG. 1e, except that the silicide workfunction 116 merges between the lower nanoribbons 100. Thus, there is no gate fill 112 between those nanoribbons 100, according to an embodiment. Likewise, the workfunction 117 merges between the upper nanoribbons 101. Thus, there is no gate fill 113 between those nanoribbons 101, according to an embodiment The previous relevant discussion is equally applicable here.

Figure 1G:
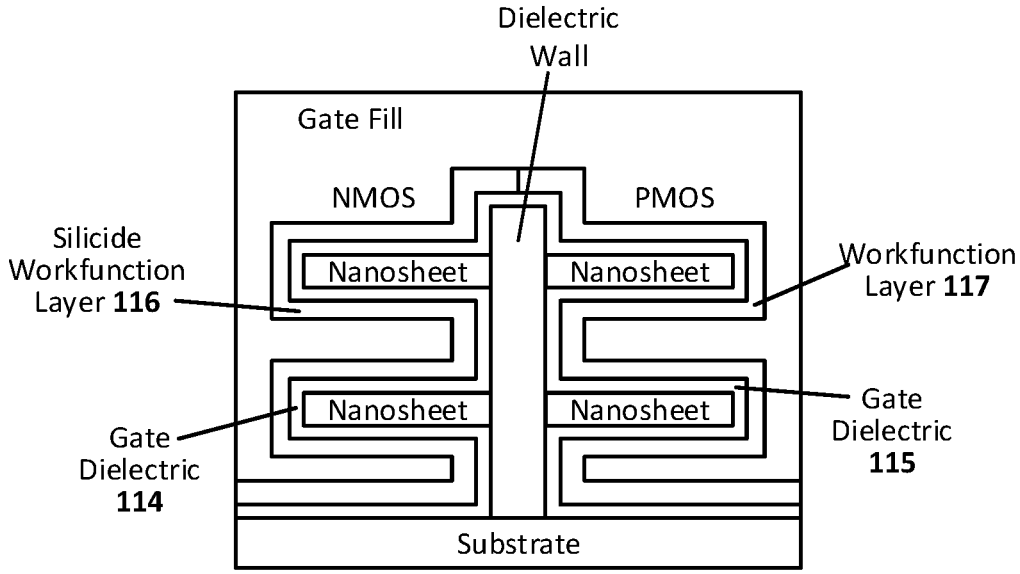
FIG. 1*g* is a cross-sectional view that illustrates an example integrated circuit configured with a forksheet transistor architecture that includes a gate structure having a silicide workfunction layer, in accordance with an embodiment of the present disclosure.

FIG. 1g is a cross-sectional view that illustrates an example integrated circuit configured with a forksheet transistor architecture that includes a gate structure having a silicide workfunction layer, in accordance with an embodiment of the present disclosure. As can be seen, a forksheet configuration has a tri-gate forked structure that has a vertically extending dielectric wall between laterally extending PMOS and NMOS devices. Such a forksheet transistor configuration can be utilized in a vertically stacked configuration as well, but affords a degree of stacking efficiency in the lateral direction as well, given the closeness of the PMOS (right side of dielectric wall) and NMOS (left side of dielectric wall) devices to either side of the dielectric wall. The laterally extending nanosheets can be similar to nanoribbons 100 and 101, with respect to semiconductor materials and size. The dielectric wall can be any suitable dielectric (e.g., silicon carbon oxide, silicon nitride, silicon oxynitride, silicon carbonitride). The previous applicable discussion with respect to gate dielectrics 114 and 115 equally applies here, as does the previously relevant discussion with respect to silicide workfunction layer 116, workfunction layer 117, and gate fill 112 and/or 113. As previously explained, the silicide workfunction layer 116 may merge between the two neighboring NMOS nanosheets extending laterally from the dielectric wall, such that there is no gate fill metal between those two nanosheets; likewise, the workfunction layer 117 may merge between the two neighboring PMOS nanosheets extending laterally from the dielectric wall, such that there is no gate fill metal between those two nanosheets. In the example shown, the gate fill metal is between the laterally extending nanosheets.

Methodology

FIGS. 2-12 are cross-sectional views that collectively illustrate an example process for forming an integrated circuit configured with a stacked transistor architecture that includes a lower gate structure having a silicide workfunction layer, in accordance with some embodiments of the present disclosure. The methodology may be used, for instance, to form the structures shown in FIGS. 1a-f, although numerous configurations and variations will be apparent in light of this disclosure.

Figure 2:
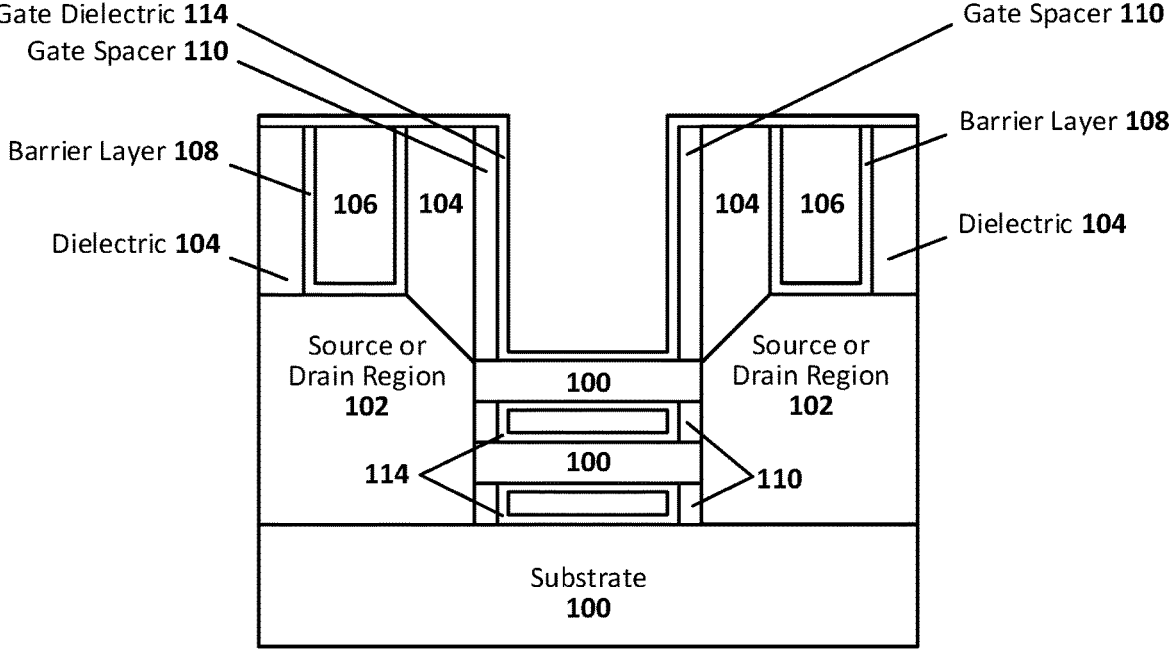
FIGS. 2-12 are cross-sectional views that collectively illustrate an example process for forming an integrated circuit configured with a stacked transistor architecture that includes a lower gate structure having a silicide workfunction layer, in accordance with some embodiments of the present disclosure.

FIG. 2 shows an example integrated circuit structure after the source and drain regions 102 have been formed, and after contact structures (106 and 108) have been formed on those source and drain regions 102, according to an embodiment. As can be further seen, a gate-last process is being used, wherein dummy gate materials have been removed from the gate trench, and the nanoribbons 100 therein have been released, and gate dielectric 114 has been deposited. In one example embodiment, once the channel region is exposed, the nanoribbons 100 are released, for instance, by a selective etch that removes SiGe layers of an alternating silicon-SiGe multilayer fin structure to release silicon nanoribbons 100, or a selective etch that removes the silicon layers of the multilayer fin structure to release SiGe nanoribbons 100. Other channel materials can be used as well, as explained above. The gate dielectric 114 may be, for instance, conformally deposited using atomic layer deposition (ALD) or chemical vapor deposition (CVD). In one specific embodiment where the nanoribbons are silicon, the gate dielectric layer 114 includes a first layer of silicon dioxide (e.g., 0.5 to 2.5 nm thick) and a second layer of hafnium oxide on the first layer (e.g., 0.5 to 2.5 nm thick). Another example embodiment may include just the hafnium oxide layer. Note how gate dielectric 114 deposits on the gate spacer 110, as well as nanoribbons 100 and the underlying substrate 100, which is fine, according to some embodiments. The previous relevant discussion with respect to gate dielectric layers is equally applicable here.

Figure 3:
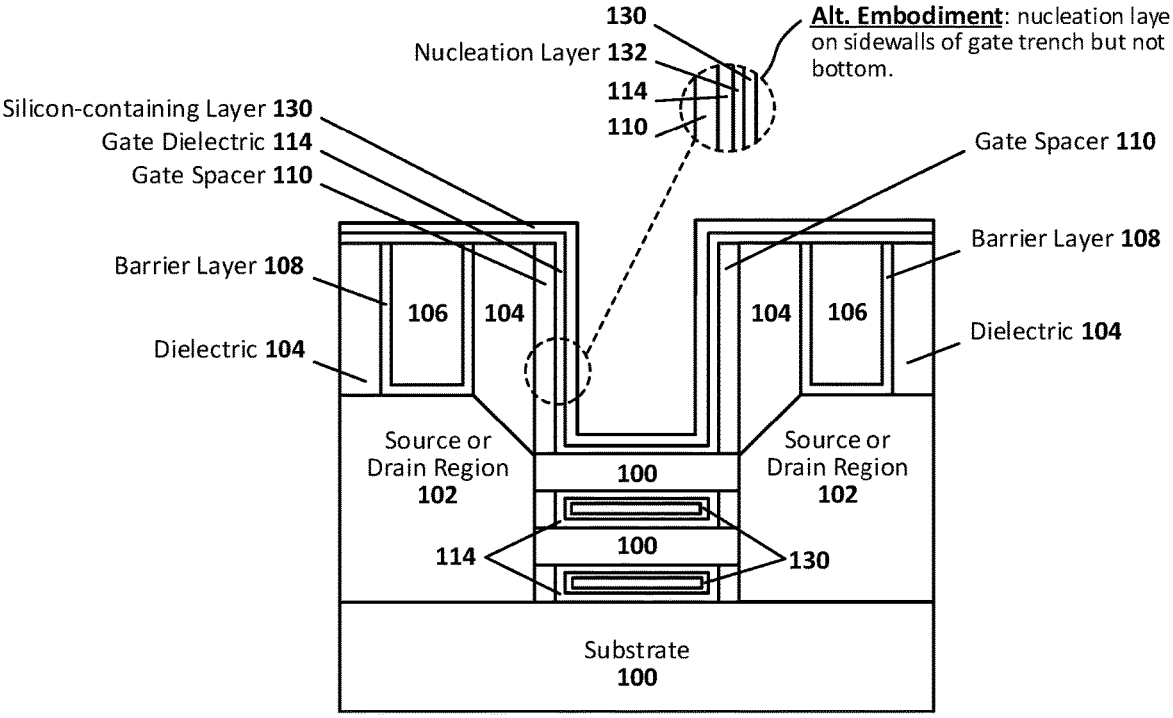
Figure 4A:
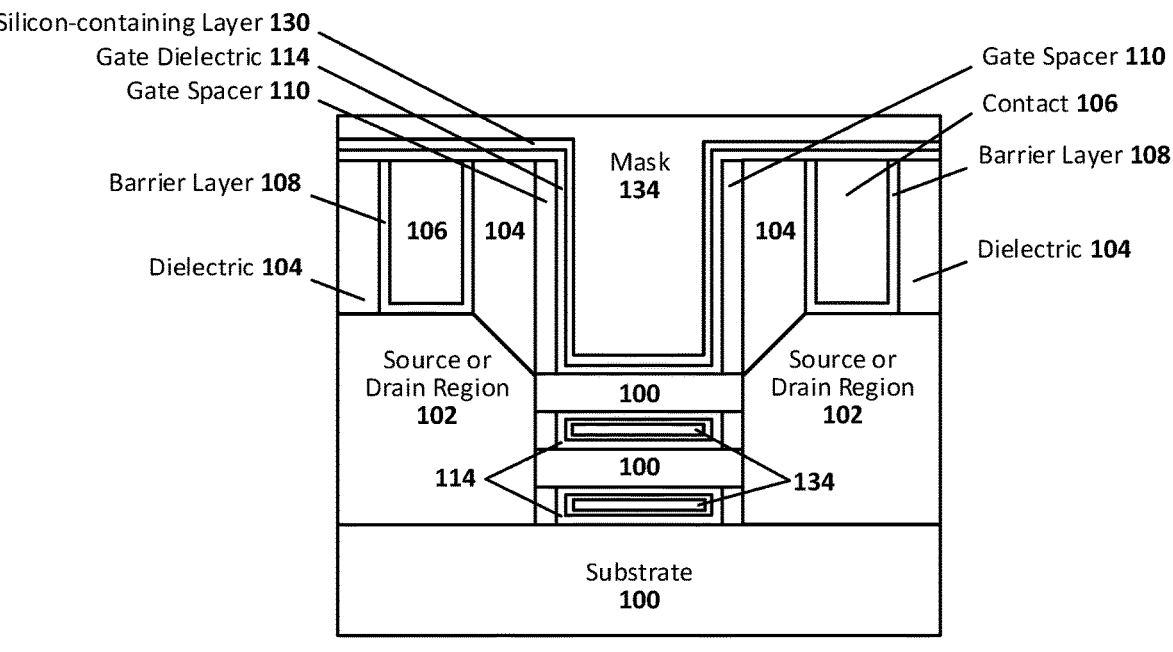
Figure 4B:
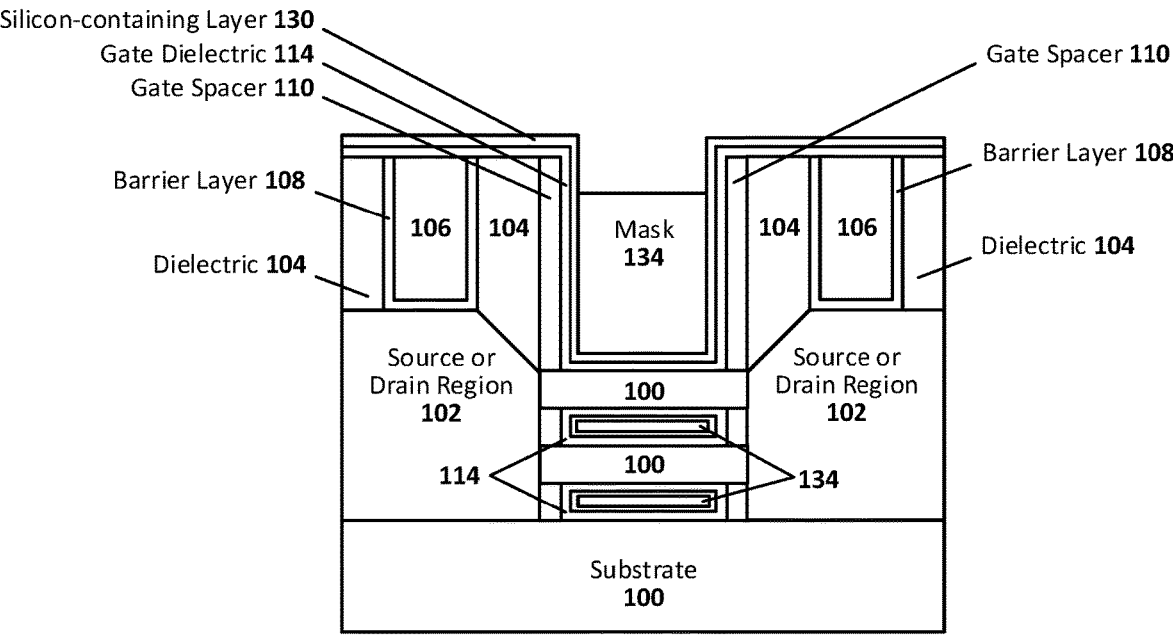
Figure 4C:
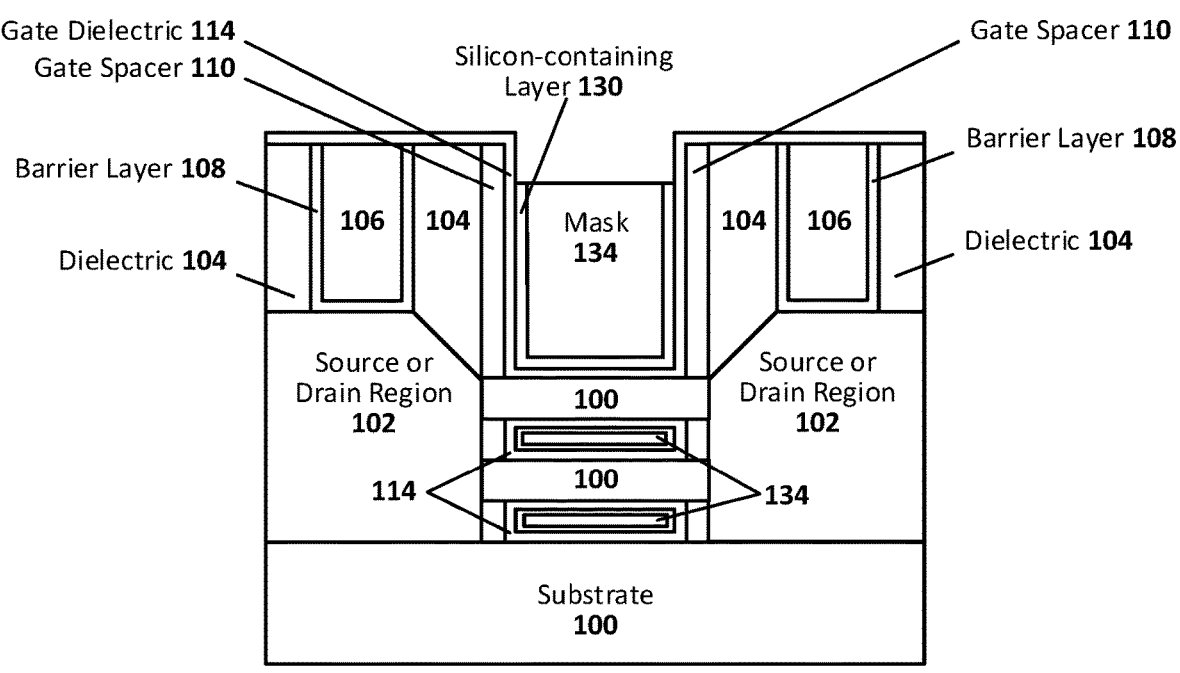
Figure 4D:
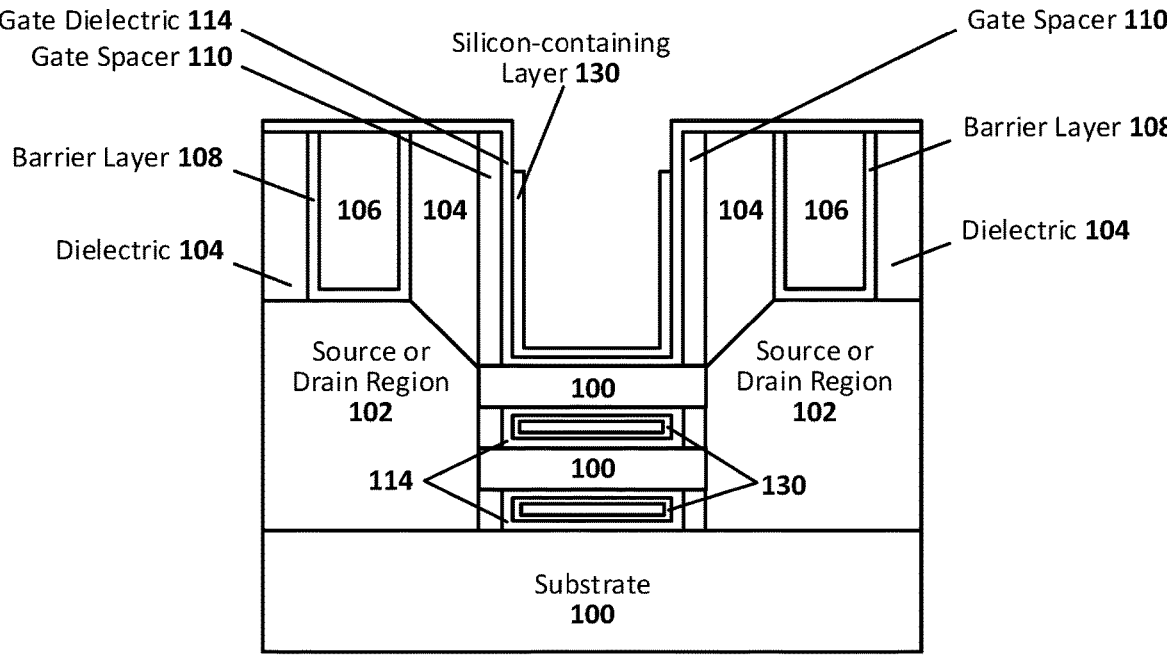
Figure 5:
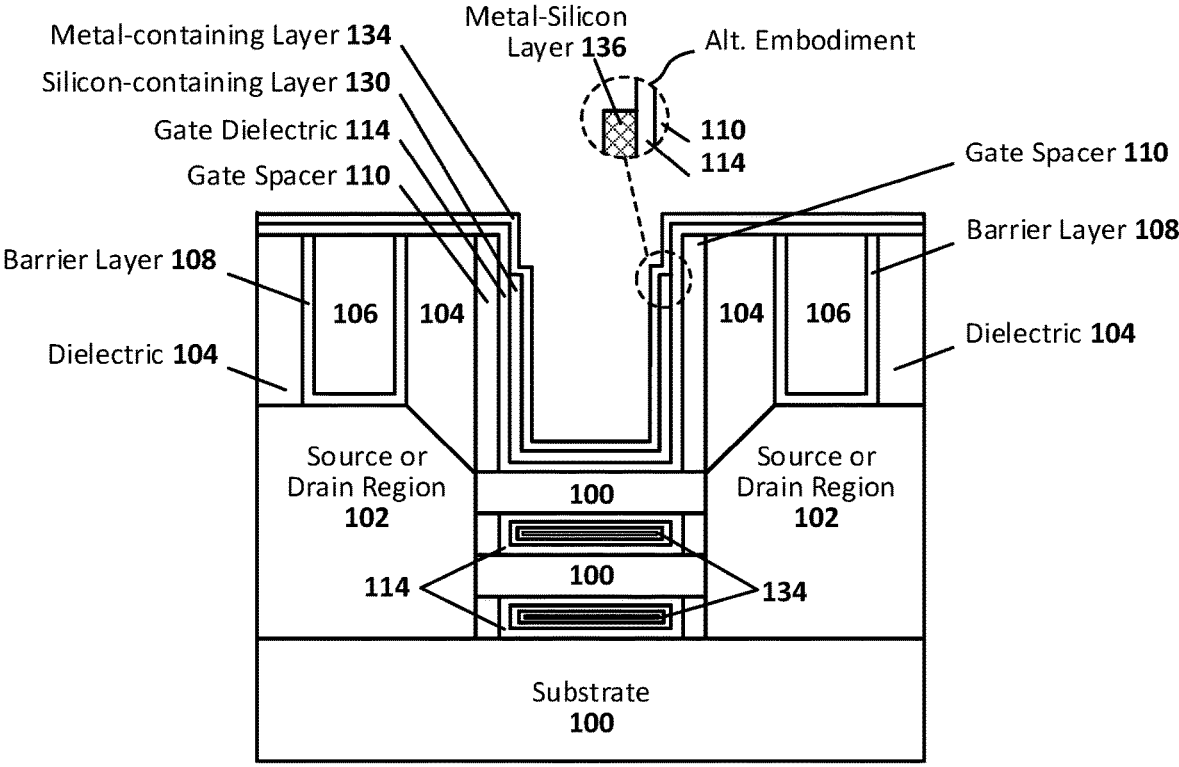

With the gate dielectric 114 in place, the gate electrode can then be formed. As previously explained, the gate electrode includes a silicide workfunction layer 116, and may further include gate fill and a nucleation layer. The silicide workfunction layer 116 can be formed by separately depositing silicon-containing and metal layers (as shown in FIGS. 3 through 5, as will be discussed in turn), or by depositing a layer containing both silicon and metal (as shown in FIG. 5, as will be discussed in turn). The particular silicide to be included in layer 116 may vary from one embodiment of the next, but in general may accommodate operation with a particular semiconductor material of the channel region to be gated, such as the example case where a workfunction to be provided by silicide workfunction layer 116 facilitates a desired threshold voltage with the semiconductor material of the given channel region. In some embodiments, silicide workfunction layer 116 comprises a silicide that, for example, may be represented as $M_xSi_yD_z$, wherein the silicide comprises, in stoichiometric proportions x, y and z, silicon, a component D, and another component M. Other example embodiments may not include component D (z equals zero). In some example cases, $M_xSi_yD_z$ silicide formulations may provide an advantageously low and temperature-stable threshold voltage ($V_t$) for NMOS transistor that have a silicon channel. As used herein with reference to the composition of a silicide, "component" refers to an element of compound which has been or is to be included, in some form, as part of a silicide. It is to be noted that the labels "x," "x1," "x2," "y" and/or "z" are variously used herein to represent stoichiometric proportions of a given silicide. However, the meaning of such labels with respect to one silicide described herein is to be distinguished from, and may not be limiting on, the meaning of such labels with respect to another silicide described herein. To this end, the present disclosure is intended to cover the various full stoichiometric ranges for silicide workfunction materials disclosed herein. For example, for a silicide workfunction layer 116 that includes titanium and silicon (TiSi), the ratio of titanium to silicon and silicide phase can be adjusted to tune workfunction and metal resistance, which in turn enables different threshold voltages. To this end, compound may include multiple bond configurations and/or phases, such as a first phase that includes a first stoichiometry or bonding configuration ($TiSi_2$) and a second phase that includes a second stoichiometry or bonding configuration ($Ti_5Si_4$).

Component D, if present (z is greater than zero), may include any of a variety of elements or compounds that are chemically able to form a solid with silicon. In some embodiments, component D may include one or more elements each from a respective one of groups IIIa, IVa, or Va (e.g., wherein the one or more elements are non-metal elements). In some embodiments, deposition to form a first material (e.g., $Si_yD_z$) is performed using one or more silicon precursors, such as, silane, disilane, trisilane, tetrasilane and dichiorosilane. Component M may include one or more metal elements that are able to form a silicide with a silicon-containing material (e.g., $Si_yD_z$). For example, component M may include one or more transition metal elements each from a respective one of groups IVb, Vb, VIb, VIIB, or VIIIb. Alternatively or in addition, component M may include one or more metal elements each from a respective one of groups IIIa, IVa, or Va. In some embodiments, component M is a compound which includes both a metal M1 and another metal M2 Which is of a different metal type than that of metal M1. For example, metal M1 may be an element from one of groups IIIa, IVa, Va, IVb, Vb, VIb, VIIB, or VIIIb, and metal M2 is a different element from another one of (or alternatively, from the same one of) groups IIIa, IVa, Va, Vb, VIb, VIIIB, or VIIIb. In some embodiments, one or more metals of component M (e.g., including one or each of two different metals M1, M2) may each be a respective one of aluminum (Al), gallium (Ga), hafnium (Hf), indium (In), niobium (Nb), osmium (Os), ruthenium (Ru), tantalum (Ta), titanium (Ti), tungsten (W), yttrium (Yt), or zirconium (Zr), and component D includes one of arsenic (As), gallium (Ga), germanium (Ge), nitrogen (N), phosphorus (P), or antimony (Sb). In other embodiments, component D omits any metal element. Some specific examples of silicide workfunction layer 116 which include silicon, a component M and a component D, are $Ta_xSi_yP_z$, $Ti_xSi_yGe_z$, $Ta_{x1}Al_{x2}Si_y$, $Ta_{x1}Ti_{x2}Si_y$, $Hf_{x1}Ga_{x2}Si_ySb_z$, $Ti_{x1}Al_{x2}Si_yGe_2$, or $W_{x1}Y_{x2}Si_yAs_2$. In still other embodiments, silicide workfunction layer 116 comprises silicon and a component M, but omits any component D, such as examples where M includes aluminum (Al), hafnium (Hf), tantalum (Ta), titanium (Ti), or tungsten (W). Some specific examples of silicide workfunction layer 116 which include silicon and a component M but no component D (z equals zero), are $Al_xSi_y$, $Hf_xSi_y$, $Ta_xSi_y$, or $W_xSi_y$.

Now, with further reference to FIG. 3, a silicide workfunction layer 116 can be formed on or otherwise over gate dielectric 114. In particular, FIG. 3 shows the example integrated circuit structure of FIG. 2, after a silicon-containing layer 130 has been deposited on the gate dielectric 114, according to an embodiment. The silicon-containing layer 130 may be, for instance, conformally deposited using ALD or CVD. In one example embodiment, silicon-containing layer 130 includes a compound $Si_yD_z$ comprising silicon and component D as previously described. In some example cases, silicon-containing layer 130 is all silicon (y equals one, z equals zero). In some other example cases, silicon-containing layer 130 includes, for example, at least 51% silicon, such as $Si_{0.51}Ge_{0.49}$ (y equals 0.51, z equals 0.49). In a more general sense, silicon-containing layer 130 can have any concentration of silicon that will allow a silicidation process to occur. The thickness of silicon-containing layer 130 can vary based on desired thickness of silicide workfunction layer, but in some embodiments is in the range of 0.5 to 10 nm, such as the example case where silicon-containing layer 130 includes a compound $Si_yD_z$ comprising silicon and component D, wherein layer 130 is deposited conformally to provide a uniform, continuous film having a thickness which, for example, is equal to or less than 5 nm (e.g., 1 to 3 nm).

As can be further seen in the alternative embodiment of FIG. 3 set-off with a dashed circle, the lower gate electrode may further include a nucleation layer 132 between the gate dielectric 114 and the silicide workfunction layer 116. The nucleation layer 132 may be, for instance, conformally deposited using ALD or CVD. The previous relevant discussion with respect to nucleation layer 132 is equally applicable here. In some cases, nucleation layer 132 is a relatively thin layer of titanium nitride that has a thickness in the range of 2 to 10 angstroms. In some other example cases, the nucleation layer 132 includes silicon and a metal of the later-deposited metal-containing layer 134, although other metals can be used as well. As previously explained, this nucleation layer 132 may be used in some example embodiments, to help reduce oxidation of the subsequently-deposited silicon-containing layer 130 (or metal-silicon layer 136, as the case may be, and as will be discussed in turn with reference to the alternative embodiment shown in FIG. 5).

In some embodiments, one or more portions of silicon-containing layer 130 may be selectively etched or otherwise removed, so as to prevent a formation of unwanted silicide. A masking process can be used to accomplish the selective etch, such as collectively shown in FIGS. 4*a-d*. In more detail, FIG. 4*a* shows the example integrated circuit structure of FIG. 3, after material for mask 134 has been deposited on the gate dielectric 114, and FIG. 4*b* shows the example integrated circuit structure of FIG. 4*a*, after mask 134 has been recessed, according to some embodiments. The mask 134 can be, for instance, a spin-on carbon hardmask or photoresist or any other suitable lithography mask that can be selectively etched (e.g., isotropic etch), relative to the gate dielectric 114 and/or other exposed surfaces. The depth of the recess etch will effectively define where the upper surface of the silicide workfunction layer 116 will be. In the example embodiment shown, mask 134 is etched down into the gate trench, such that the top surface of mask 134 is about 10 to 50 nm below the uppermost surfaces of dielectric 104 and gate spacer 110. In another example embodiment, mask 134 can be etched so that the top surface of mask 134 is coplanar with the uppermost surfaces of dielectric 104 and gate spacer 110, or coplanar with the uppermost surface of the excess gate dielectric 114 on the top surface of the structure. FIG. 4*c* shows the example integrated circuit structure of FIG. 4*b*, after the unmasked portion of silicon-containing layer 130 is etch away (e.g., isotropic etch), according to some embodiments. FIG. 4*d* shows the example integrated circuit structure of FIG. 4*c*, after mask 134 has been removed (e.g., ash-etch or other suitable mask removal etch), according to some embodiments.

FIG. 5 shows the example integrated circuit structure of FIG. 4*c*, after metal-containing layer 134 is deposited onto the recessed silicon-containing layer 130, according to some embodiments. The metal-containing layer 134 may be, for instance, conformally deposited using ALD or CVD. In some cases, metal-containing layer 134 is a continuous film of a single metal (M), such as a layer of titanium. In another example embodiment, metal-containing layer 134 includes two metals (M1 and M2), such as titanium and tantalum. The thickness of metal-containing layer 134 can vary, but in some example cases in in the range of 0.5 to 10 nm, such as the example case where metal-containing layer 134 includes a compound $Si_yD_z$ comprising 1 to 5 nm (e.g., 1 to 3 nm). In any such cases, note that some of metal-containing layer 134 may be deposited on silicon-containing layer 130 and some may be deposited on the gate dielectric 114 or nucleation layer 132 (if present). As will be appreciated, the portion of metal-containing layer 134 on layer 130 will react during subsequent annealing to form self-aligned silicide structures, and the excess portion of metal-containing layer 134 not on layer 130 will not react and will be removed, as will be explained in turn. For example, a subsequent reaction between layer 130 with layer 134, may result in the formation of a silicide $M_xSi_yD_z$, such as a bi-metallic silicide $M1_{x1}M2_{x2}Si_yD_z$, at the various locations where the compound $Si_yD_z$ of layer 130 is located.

As can be further seen in the alternative embodiment of FIG. 5 set-off with a dashed circle, the silicon-containing layer 130 and metal-containing layer 134 can be replaced by a single deposition of a metal-silicon layer 136 such as titanium-silicon, or titanium-tantalum-silicon, which also can be deposited by ALD or CVD or sputtering, for instance. The metal-silicon layer 136 layer is shown with cross-hatching in FIG. 5 and can have a thickness, for instance, in the range of 0.5 to 20 nm (e.g., 2 to 10 nm). Further note that metal-silicon layer 136 can be masked and etched to recess metal-silicon layer 136, in a similar fashion as described with respect to silicon-containing layer 130. In still other example embodiments, metal-silicon layer 136 may include a non-annealed compound of $M_xSi_yD_z$ (e.g., such as a bi-metallic silicide $M1_{x1}M2_{x2}Si_yD_z$), as previously discussed with respect to the target silicide layer 116 to be formed.

Figure 6:
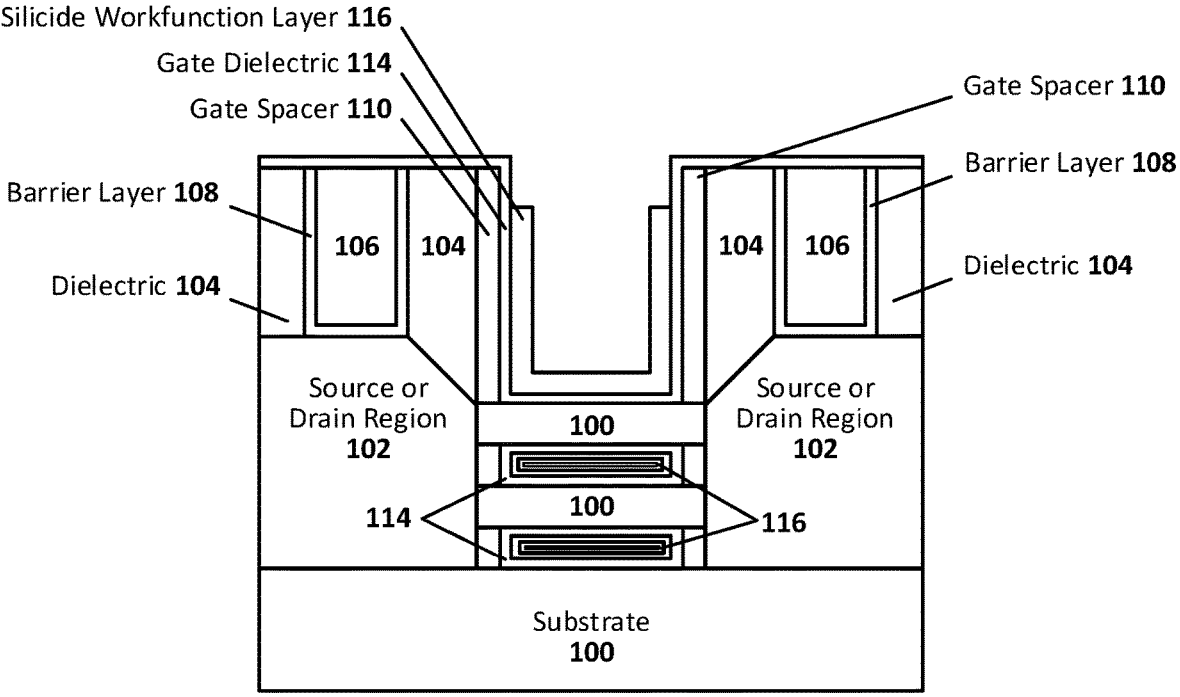

FIG. 6 shows the example integrated circuit structure of FIG. 5, after annealing has been carried out to convert metal-containing layer 134 and silicon-containing layer 130, or metal-silicon layer 136, into silicide workfunction layer 116, according to some embodiments. Note that any unreacted portion of metal-containing layer 134 can be removed (e.g., via a wet etch) after the annealing process. In this case, a mask can be deposited and etched or otherwise patterned to protect the newly formed silicide workfunction layer 116 while any excess metal-containing layer 134 is removed. The annealing temperature and duration can vary from one embodiment to the next, but in some example cases is about 400 to 500 degrees Celsius for about 60 to 180 seconds. The thickness of silicide workfunction layer 116 can vary, but in some embodiments is in the range of 1 to 20 nm (e.g., such as 2 to 10 nm). Other embodiments may react to form silicide without further processing such as annealing. The resulting silicide workfunction layer 116 may contribute to performance characteristics which are superior to those of standard NMOS work function metal materials, such as aluminum containing workfunction materials.

Figures 7A, 7B:
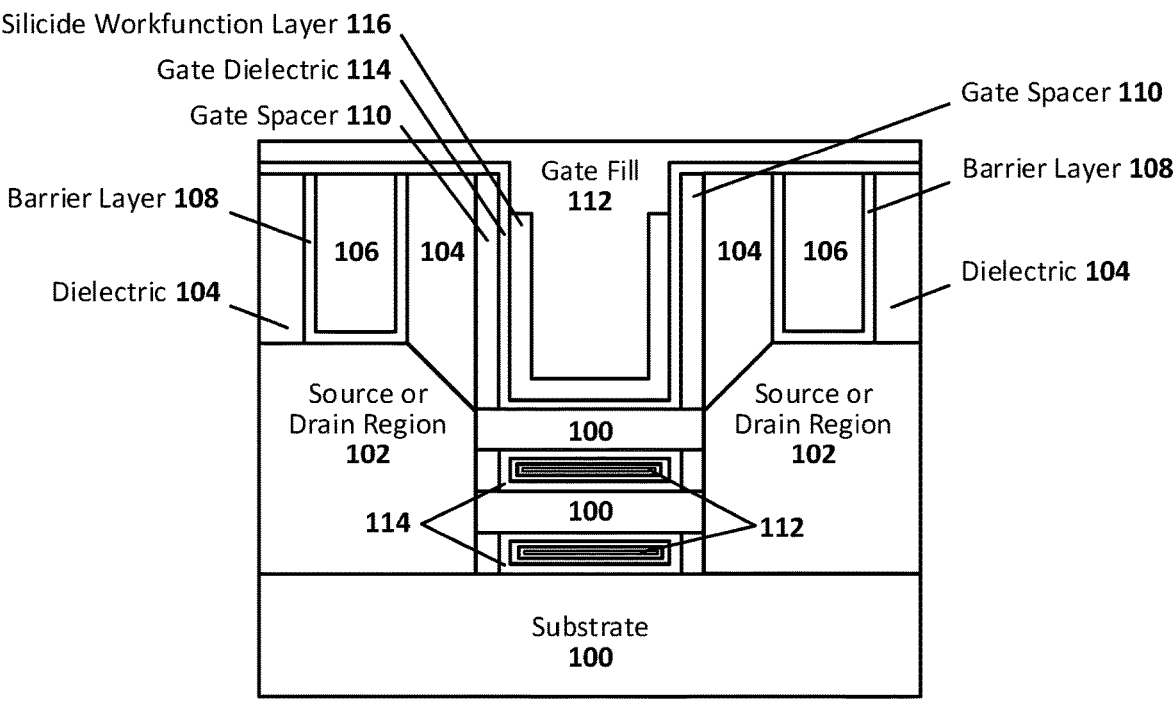

FIG. 7*a* shows the example integrated circuit structure of FIG. 6, after gate fill 112 material is deposited to fill any remaining voids within the gate trench, according to an embodiment. The previous relevant discussion is equally applicable here. The gate fill 112 may be, for instance, tungsten or cobalt deposited using ALD or CVD or other gate fill deposition technique (e.g., electroplating). FIG. 7*b* shows the example integrated circuit structure of FIG. 7*a*, after excess gate fill 112 material has been removed (e.g., by CMP), according to an embodiment. Note in this example embodiment that other excess materials on the top surface of the structure can also be removed at this time via the CMP process, including any excess gate dielectric 114, nucleation layer 132 (if present), and/or other excess materials that may be present thereon as a result of prior non-selective depositions. Thus, vias, contacts and/or other interconnect features can be provisioned to contact the now exposed source/drain contacts and gate structure of what will become the lower device layer, after the upper device layer has been formed.

Figure 8:
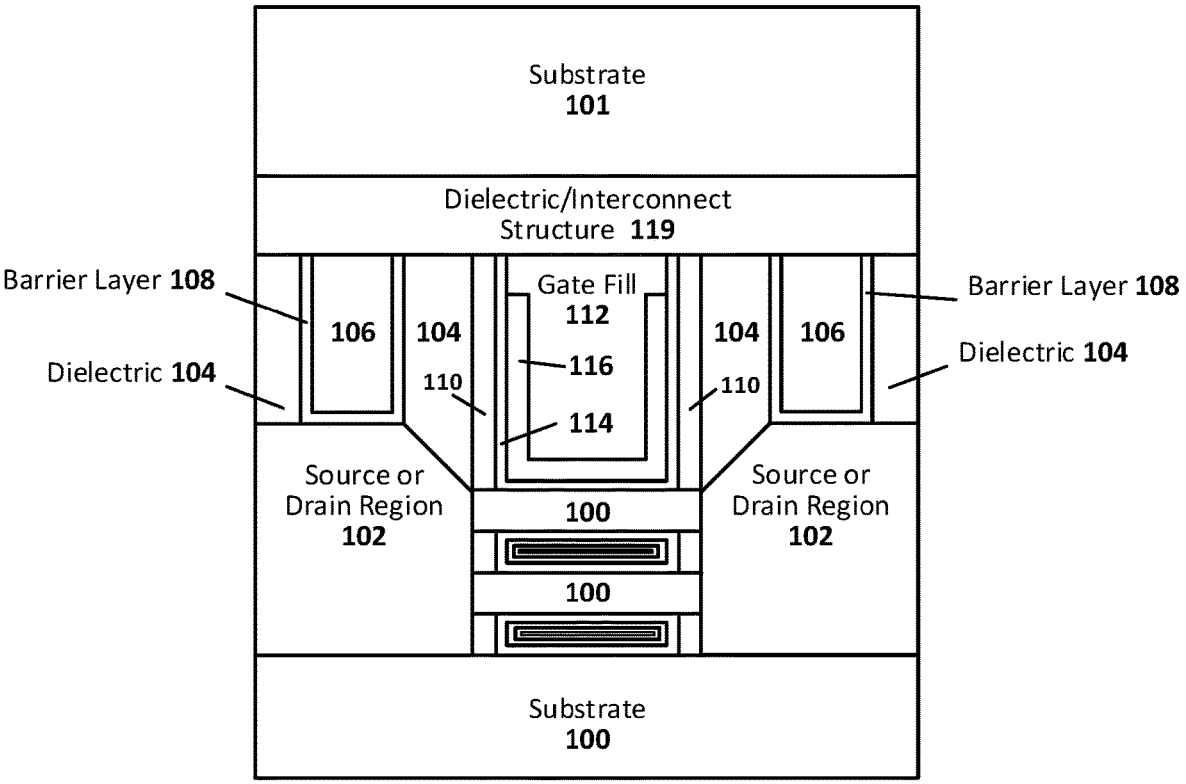

FIG. 8 shows the example integrated circuit structure of FIG. 7*b*, after dielectric structure 119 is formed to provide contacts and interconnect to the lower device layer, and after upper substrate 101 is bonded, according to an embodiment. In other embodiments, a backside contact scheme can be used, and dielectric structure 119 can be just a bonding layer (e.g., silicon oxide). The previous relevant discussion is equally applicable here, and any number of frontside and backside interconnect schemes can be used. Substrate 101 can be, for instance, a bulk silicon or germanium substrate or layer, or a bulk SiGe substrate or layer, or a multilayer substrate or structure (e.g., alternating layers of silicon and SiGe) suitable for nanoribbon or nanowire configurations.

Figure 9:
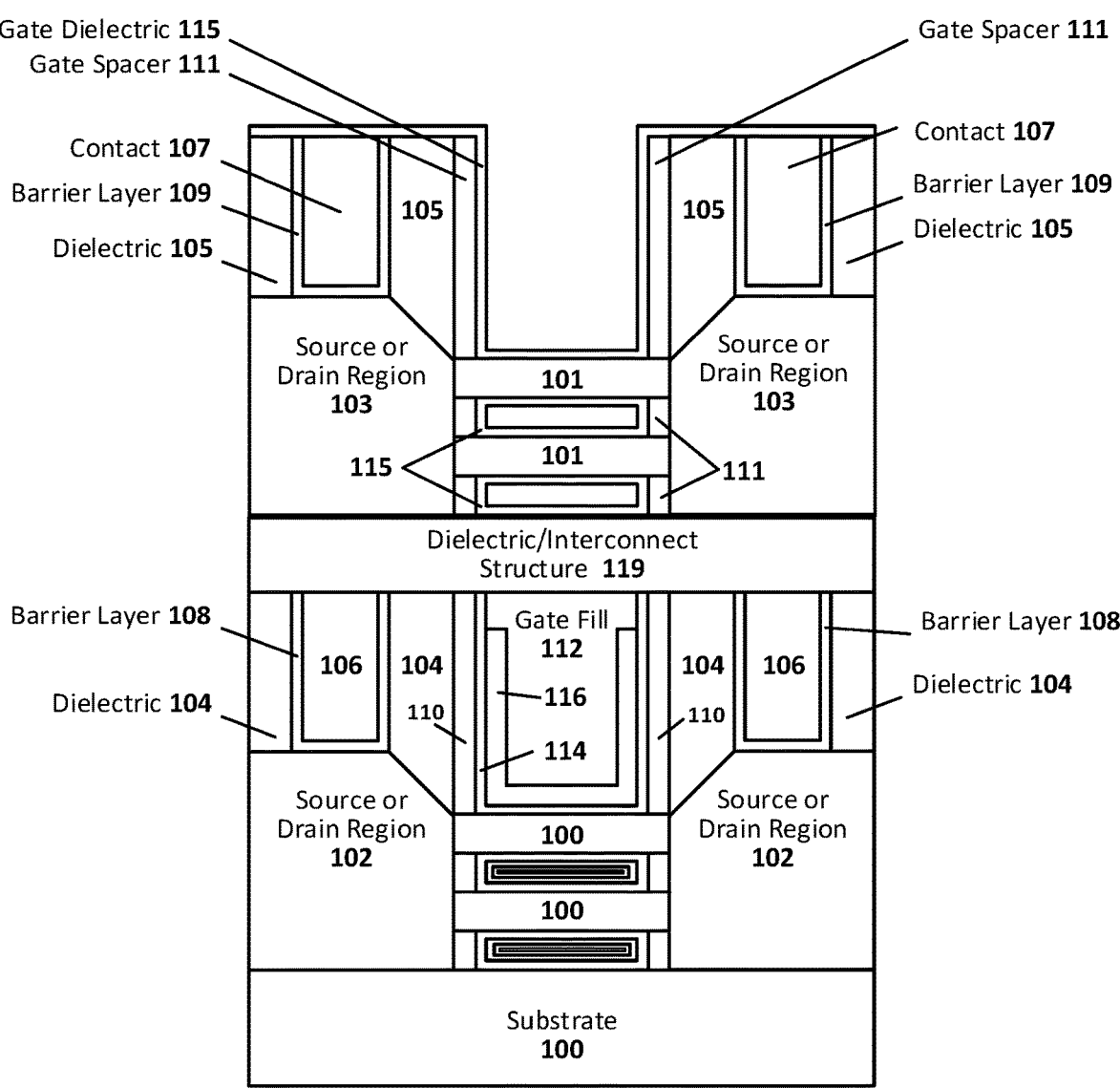

FIG. 9 shows the example integrated circuit structure of FIG. 8, after an upper device layer of the stacked architecture has been formed, according to an embodiment. As can be seen, the upper device layer of this example case includes epitaxial source and drain regions 103 to either side of a channel region including two nanoribbons 101. Contact structures (107 and 109) have been formed on those source and drain regions 103. As can be further seen, a gate-last process is being used, wherein dummy gate materials have been removed from the upper gate trench, and nanoribbons 101 therein have been released, and gate dielectric 115 has been deposited. The previous relevant discussion with respect to source/drain regions, channel configurations, and gate dielectrics is equally applicable here.

Figure 10:
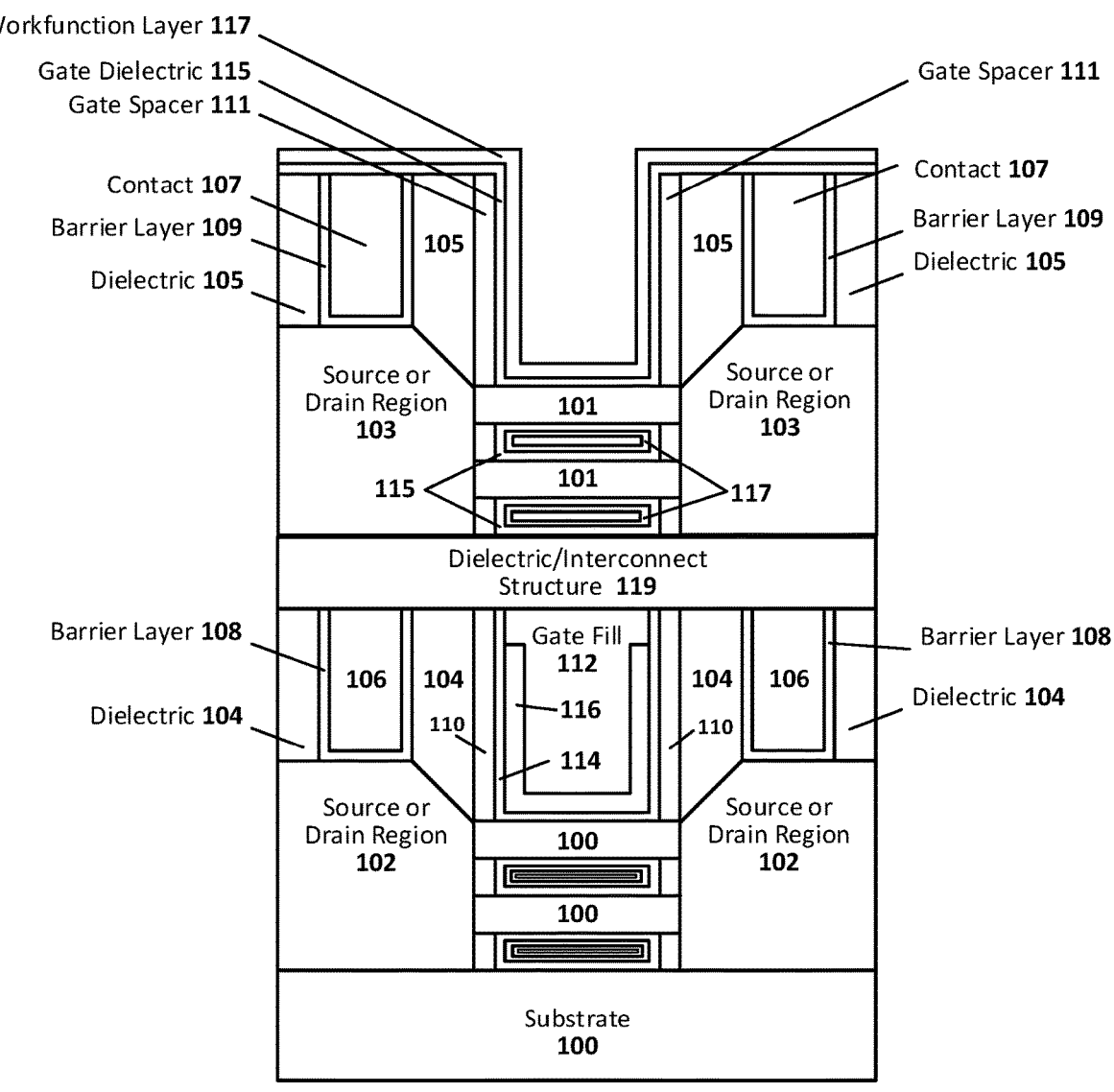
Figure 11:
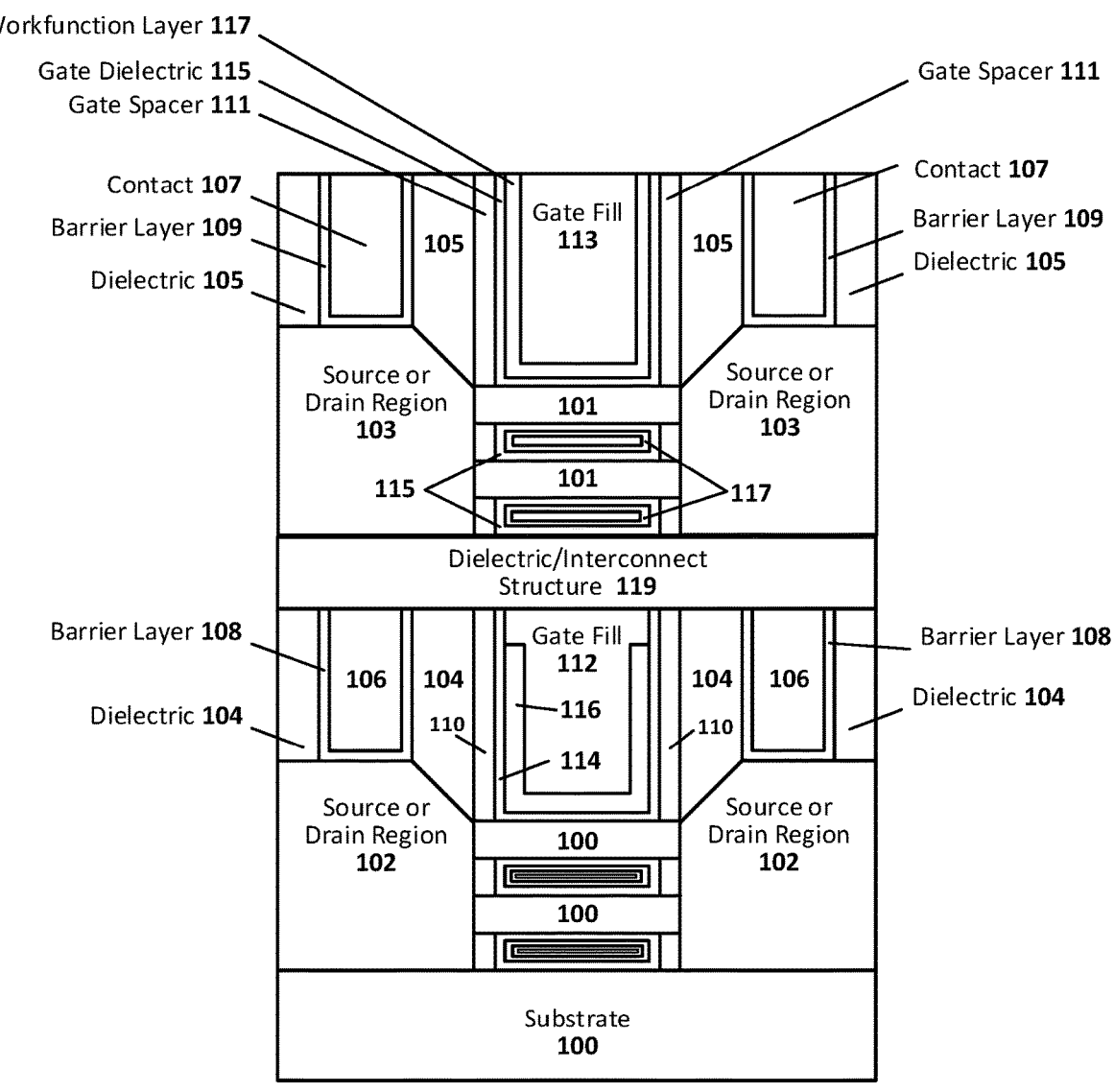
Figure 12:
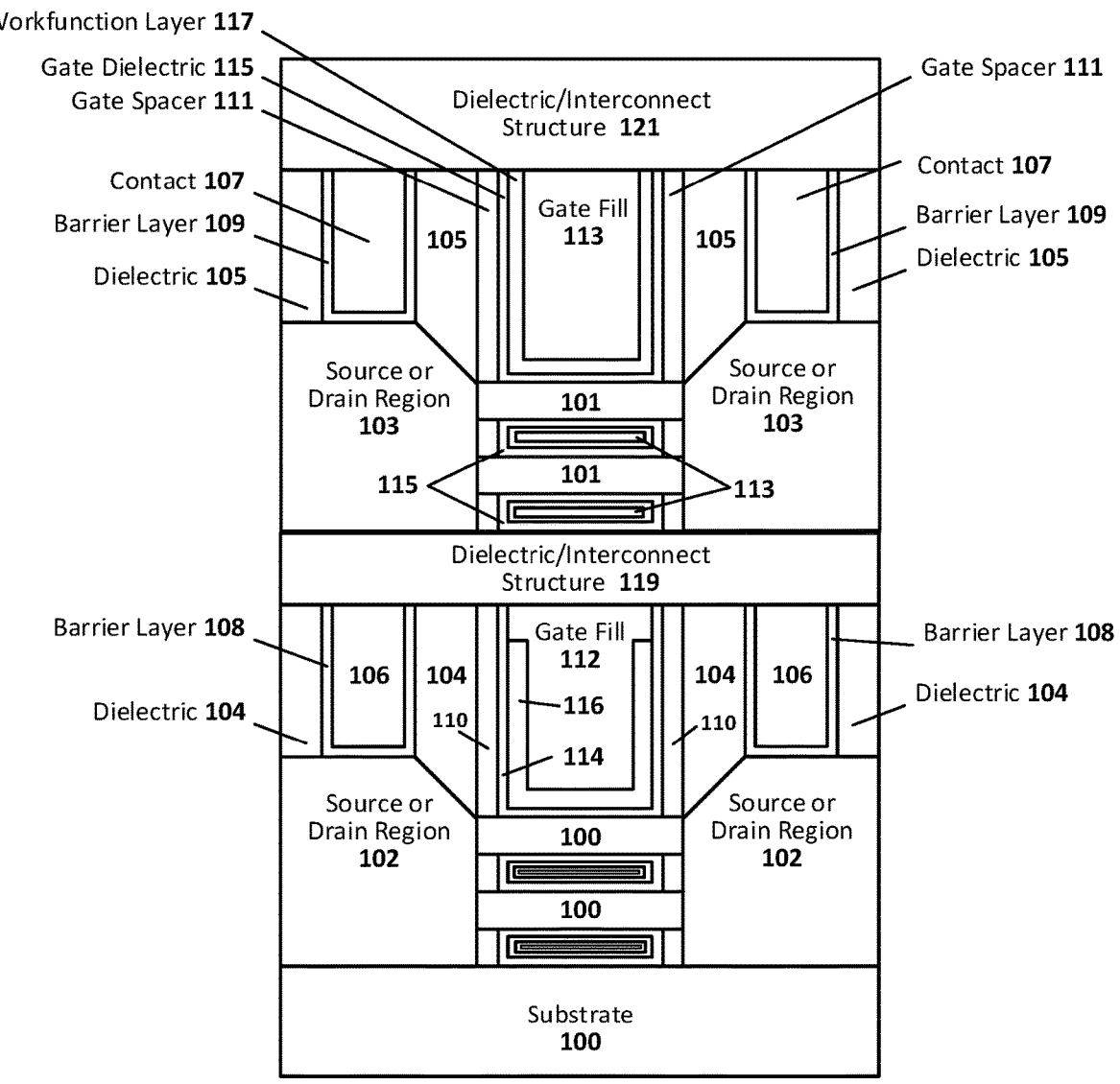

With the gate dielectric 115 in place, the upper gate electrode can then be formed. FIG. 10 shows the example integrated circuit structure of FIG. 9, after workfunction layer 117 has been deposited on the gate dielectric 114, according to an embodiment. The workfunction layer 117 may be, for instance, conformally deposited using ALD or CVD. The previous relevant discussion with respect to workfunction 117 being a non-silicide (e.g., titanium nitride) is equally applicable here. The thickness of silicide workfunction layer 117 can vary, but in some embodiments is in the range of 2 to 10 nm. FIG. 11 shows the example integrated circuit structure of FIG. 10, after gate fill 113 material is deposited to fill any remaining voids within the upper gate trench, and planarized, according to an embodiment. The previous relevant discussion is equally applicable here. Again, note in this example embodiment that other excess materials on the top surface of the structure can also be removed at this time, including any excess gate dielectric 115 and/or other excess materials that may be present thereon as a result of prior processing. Thus, vias, contacts and/or other interconnect features can be provisioned to contact the now exposed upper source/drain contacts and upper gate structure. FIG. 12 shows the example integrated circuit structure of FIG. 11, after dielectric structure 121 is formed to provide contacts and interconnect to the upper device layer, according to an embodiment. The previous relevant discussion with respect to frontside and backside contacts is equally applicable here.

Figure 13:
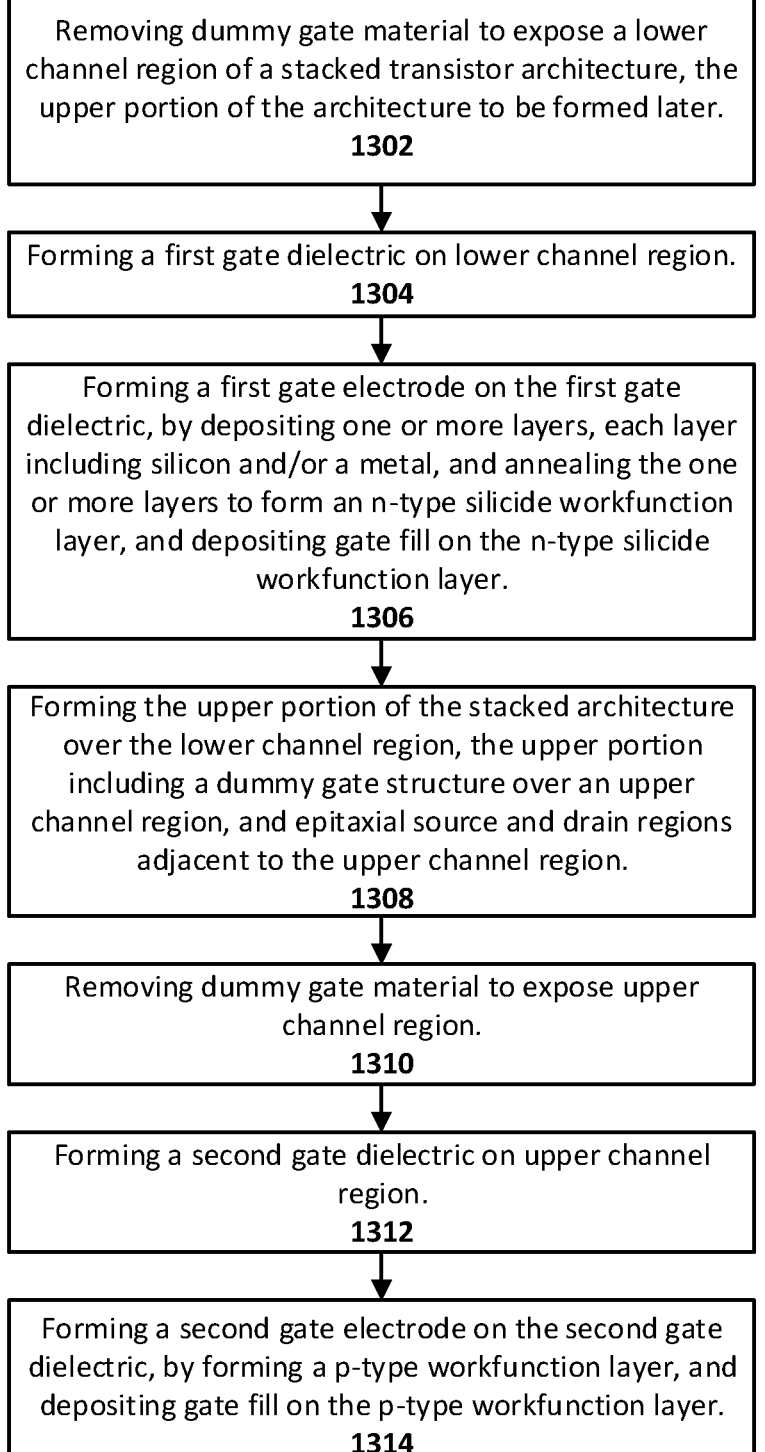
FIG. 13 illustrates a methodology for providing an integrated circuit configured with a stacked transistor architecture that includes a lower gate structure having a silicide workfunction layer, in accordance with some embodiments of the present disclosure.

FIG. 13 illustrates a methodology for providing an integrated circuit configured with a stacked transistor architecture that includes a lower gate structure having a silicide workfunction layer, in accordance with some embodiments of the present disclosure. The methodology may be used, for instance, to form the structures shown in FIGS. 1a-f or FIGS. 2-12, although numerous configurations and variations will be apparent in light of this disclosure. As can be seen, the method generally includes a first portion that involves formation of the lower device layer, and a second portion that involves formation of the upper device layer on the lower device layer. Thus, the lower device layer will be subjected to the processing temperature of the upper device layer. The example method assumes that processing of the lower portion has progressed to the point where there is a dummy gate structure over the lower channel region, and there are epitaxial source and drain regions adjacent to that lower channel region.

The method includes removing 1302 dummy gate material to expose a lower channel region of the stacked transistor architecture, and forming 1304 a first gate dielectric on the lower channel region. The previous relevant discussion is equally applicable here. The method continues with forming 1306 a first gate electrode on the first gate dielectric, by depositing one or more layers, each layer including silicon and/or a metal, annealing the one or more layers to form a silicide workfunction layer, and depositing gate fill metal on the silicide workfunction layer.

In an embodiment, the silicide workfunction layer includes silicon, a component M (which comprises one or more metal elements), and in some embodiments, a component D (e.g., silicide $M_xSi_yD_z$, such as a bi-metallic silicide $M1_{x1}M2_{x2}Si_yD_z$). The previous relevant discussion is equally applicable here. As previously explained, formation of the silicide workfunction layer may include depositing different materials which subsequently react with one another to form a silicide. Depositing the different materials may include either successively depositing different layers such as a silicon-containing layer and a metal-containing layer (e.g., as shown in FIGS. 3 through 5), or depositing a single layer that includes both silicon and metal such as a silicon-titanium layer (e.g., as shown in FIG. 5). For example, forming the silicide workfunction layer may include depositing a first material on the gate dielectric (or on nucleation layer, if present) and, subsequently, depositing a second material on at least a portion of the first material. One of the first material and the second material may include a component M (e.g., one or two metals) and the other of the first material and the second material includes both silicon and a component D, according to an embodiment. In such an example case, forming the silicide workfunction layer may further comprise reacting (e.g., via an annealing process) respective portions of the first material and the second material to form the silicide. As previously explained, forming the silicide workfunction layer may, in some embodiments, further comprise etching away a portion of the first material prior to depositing the second material. The resulting silicide workfunction layer may contribute to improved transistor performance including, for example, temperature-stable threshold voltage ($V_t$).

Now with lower gate structure formed, and with further reference to FIG. 13, the method continues with forming 1308 an upper portion of the stacked architecture. In an embodiment, the upper portion includes a dummy gate structure over an upper channel region that is above the lower channel region, and epitaxial source and drain regions adjacent to the upper channel region. The method continues with removing 1310 the dummy gate material to expose the upper channel region. The method then continues with forming 1312 a second gate dielectric on the upper channel region, and forming a second gate electrode on the second gate dielectric, by forming a p-type workfunction layer, and depositing gate fill on the p-type workfunction layer.

If the lower and/or upper channel regions are to be configured with nanowires or ribbons, the method may further include releasing the nanowires or ribbons with a selective etch process. For instance, the method may include releasing, via a selective etch process and prior to forming the first gate dielectric, a first nanoribbon of the lower channel region, wherein the first gate dielectric and first gate electrode wrap around the first nanoribbon. Alternatively, or in addition to, the method may include releasing, via a selective etch process and prior to forming the second gate dielectric, a second nanoribbon of the upper channel region, wherein the second gate dielectric and second gate electrode wrap around the second nanoribbon. Other gate-all-around configurations can be used as well.

In some embodiments, the method further includes forming a first source region and a first drain region, each adjacent to the lower channel region, and forming, after the first gate electrode is formed, a second source region and a second drain region, each adjacent to the upper channel region. In one such example, the first (lower) source and drain regions comprise an n-type dopant, and the second (upper) source and drain regions comprise a p-type dopant.

In some embodiments, depositing the one or more layers of the first gate electrode includes depositing a first layer comprising silicon (e.g., $Si_yD_z$, or just silicon) and then depositing a second layer comprising a metal (e.g., M, or M1 and M2), and the annealing of the first and second layers causes the silicide workfunction layer to form (e.g., silicide $M_xSi_yD_z$, or a bi-metallic silicide $M1_{x1}M2_{x2}Si_yD_z$). In some other embodiments, depositing the one or more layers of the first gate electrode includes depositing a layer comprising silicon and a metal (e.g., compound of $M_xSi_yD_z$, or a bi-metallic compound of $M1_{x1}M2_{x2}Si_yD_z$), and the annealing of the layer causes the silicide workfunction layer to form (e.g., silicide $M_xSi_yD_z$, or a bi-metallic silicide $M1_{x1}M2_{x2}Si_yD_z$).

As previously explained, some embodiments may further include a nucleation layer. In such cases, forming the first gate electrode on the first gate dielectric may include depositing, after forming the first gate dielectric and prior to depositing the one or more layers, a nucleation layer.

Computing System

Figure 14:
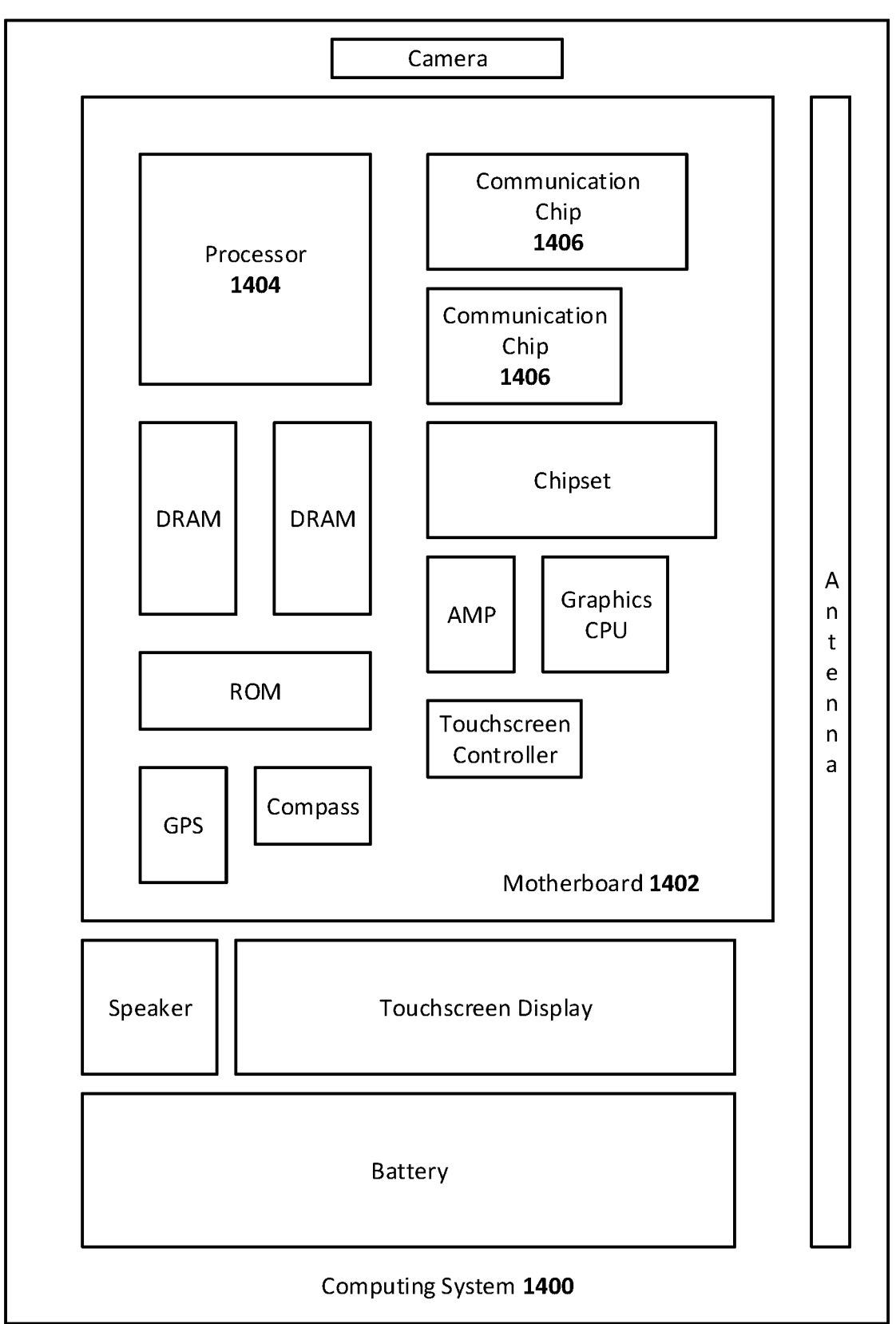
FIG. 14 illustrates a computing system implemented with one or more integrated circuit structures configured in accordance with an embodiment of the present disclosure.

FIG. 14 illustrates a computing system implemented with one or more integrated circuit structures configured in accordance with an embodiment of the present disclosure. As can be seen, the computing system 1400 houses a motherboard 1402. The motherboard 1402 may include a number of components, including but not limited to a processor 1404 and at least one communication chip 1406 (two are shown in this example), each of which can be physically and electrically coupled to the motherboard 1402, or otherwise integrated therein. As will be appreciated, the motherboard 1402 may be, for example, any printed circuit board, whether a main board or a daughterboard mounted on a main board or the only board of system 1400, etc. Depending on its applications, computing system 1400 may include one or more other components that may or may not be physically and electrically coupled to the motherboard 1402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1400 may include one or more integrated circuits configured with a stacked transistor configuration having a lower gate structure configured with a silicide workfunction layer, as variously described herein. In some embodiments, multiple functions can be integrated into one or more chips (e.g., for instance, note that the communication chip 1406 can be part of or otherwise integrated into the processor 1404).

The communication chip 1406 enables wireless communications for the transfer of data to and from the computing system 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others. The processor 1404 of the computing system 1400 includes an integrated circuit die packaged within the processor 1404. In some example embodiments of the present disclosure, the integrated circuit die of the processor 1404 includes one or more occurrences of a lower gate structure configured with a silicide workfunction layer as variously provided herein. The term "processor" may refer to any device or portion of a device that processes, for instance, electronic data from registers and/or memory to transform that electronic data into other electronic data that may be stored in registers and/or memory.

The communication chip 1406 may also include an integrated circuit die packaged within the communication chip 1406. In accordance with some such example embodiments, the integrated circuit die of the communication chip 1406 includes one or more occurrences of a lower gate structure configured with a silicide workfunction layer as variously provided herein. As will be appreciated in light of this disclosure, note that multi-standard wireless capability may be integrated directly into the processor 1404 (e.g., where functionality of any chips 1406 is integrated into processor 1404, rather than having separate communication chips). Further note that processor 1404 may be a chip set having such wireless capability. In short, any number of processor 1404 and/or communication chips 1006 can be used. Likewise, any one chip or chip set can have multiple functions integrated therein.

In various implementations, the computing system 1400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1400 may be any other electronic device that processes data or employs one or more lower gate structures configured with a silicide workfunction layer as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked CMOS transistors having any number of source/drain configurations and channel configurations, along with one or more lower gate structures configured with a silicide workfunction layer as variously provided herein. Other stacked transistor architectures may also benefit, and the present disclosure is not intended to be limited to stacked CMOS.

Further Example Embodiments

Example 1 is an integrated circuit, comprising: a first semiconductor body; a second semiconductor body above the first semiconductor body, wherein the first and second semiconductor bodies are separated from one another by insulator material; a first gate structure on the first semiconductor body, the first gate structure including a first gate electrode and a first high-k gate dielectric between the first gate electrode and the first semiconductor body, the first gate electrode including a layer comprising a compound of silicon and one or more metals; and a second gate structure on the second semiconductor body, the second gate structure including a second gate electrode and a second high-k gate dielectric between the second gate electrode and the second semiconductor body.

Example 2 includes the subject matter of Example 1, wherein the one or more metals of the compound are one or more first metals, and the first gate electrode further includes one or more second metals, wherein at least a portion of the one or more second metals is between first and second portions of the compound.

Example 3 includes the subject matter of Example 2, wherein the one or more first metals include titanium or tantalum, and the one or more second metals include cobalt or tungsten.

Example 4 includes the subject matter of Example 2 or 3, wherein the compound is a bi-metallic silicide, such that at least a portion of the one or more second metals is between first and second portions of the bi-metallic silicide. In some examples, note the compound may include multiple bond configurations and/or phases, such as a first phase that include silicon and the first metal, and a second phase that includes silicon and the second metal but not the first metal, or a first phase that includes a first stoichiometry or bonding configuration and a second phase that includes a second stoichiometry or bonding configuration.

Example 5 includes the subject matter of any one of Examples 1 through 4, wherein the one or more metals of the compound are one or more first metals, and the first gate electrode further includes one or more second metals, and wherein a top surface comprising the one or more second metals is coplanar with a top surface of the silicide workfunction layer.

Example 6 includes the subject matter of any one of Examples 1 through 4, wherein the one or more metals of the compound are one or more first metals, and the first gate electrode further includes one or more second metals, and wherein a top surface of the silicide workfunction layer is lower than a top surface comprising the one or more second metals, such that the top surface comprising the one or more second metals is not coplanar with the top surface of the silicide workfunction layer.

Example 7 includes the subject matter of any one of Examples 1 through 6, wherein each of the first high-k gate dielectric and the second high-k gate dielectric have a thickness in the range of 5 to 25 angstroms, and wherein the layer comprising the compound has a thickness in the range of 20 to 100 angstroms.

Example 8 includes the subject matter of any one of Examples 1 through 7, wherein the layer comprising the compound is a first layer, the first gate electrode further including a second layer having first and second non-contiguous portions, the first non-contiguous portion between the gate electrode and a first portion of the high-k gate dielectric, and the second non-contiguous portion between the gate electrode and a second portion of the high-k gate dielectric, and wherein the second layer is not between the gate electrode and a third portion of the high-k gate dielectric.

Example 9 includes the subject matter of Example 8, wherein the second layer has a thickness in the range of 2 to 10 angstroms.

Example 10 includes the subject matter of Example 9, wherein the second layer comprises titanium and nitrogen.

Example 11 includes the subject matter of any one of Examples 1 through 10, wherein the first gate electrode is an n-type metal oxide semiconductor (NMOS) gate electrode, and the second gate electrode is a p-type metal oxide semiconductor (PMOS) gate electrode.

Example 12 includes the subject matter of any one of Examples 1 through 11, wherein the first semiconductor body includes a first nanoribbon, and the first gate structure wraps around the nanoribbon, and wherein the second semiconductor body includes a second nanoribbon, and the second gate structure wraps around the second nanoribbon.

Example 13 includes the subject matter of any one of Examples 1 through 12, and further includes: a first source region and a first drain region, each adjacent to the first semiconductor body; and a second source region and a second drain region, each adjacent to the second semiconductor body; wherein the first source and drain regions comprise an n-type dopant, and the second source and drain regions comprise a p-type dopant.

Example 14 includes the subject matter of any one of Examples 1 through 13, wherein the compound of the first gate electrode is a silicide, and the second gate electrode is silicide-free.

Example 15 is an integrated circuit structure, comprising: a first nanoribbon; a second nanoribbon above the first nanoribbon, wherein the first and second nanoribbons are separated from one another by insulator material; a first gate structure around the first nanoribbon, the first gate structure including a first gate electrode and a first high-k gate dielectric between the first gate electrode and the first nanoribbon, the first gate electrode including a first layer and a second layer, the first layer comprising a compound of silicon and one or more first metals, and the second layer comprising one or more second metals, wherein a top surface of the first layer is lower than a top surface of the second layer, such that the top surface of the second layer is not coplanar with the top surface of the first layer; and a second gate structure around the second nanoribbon, the second gate structure including a second gate electrode and a second high-k gate dielectric between the second gate electrode and the second nanoribbon.

Example 16 includes the subject matter of Example 15, wherein the one or more first metals include titanium or tantalum, and the one or more second metals include cobalt or tungsten.

Example 17 includes the subject matter of Example 15 or 16, wherein the compound is a single metal silicide that includes one metal, or a bi-metallic silicide that includes first and second metals. In some examples, note the compound may include multiple bond configurations and/or phases, such as a first phase that include silicon and the first metal, and a second phase that includes silicon and the second metal but not the first metal, or a first phase that includes a first stoichiometry or bonding configuration and a second phase that includes a second stoichiometry or bonding configuration.

Example 18 includes the subject matter of any one of Examples 15 through 17, wherein the first layer comprising the compound has a thickness in the range of 20 to 100 angstroms.

Example 19 includes the subject matter of any one of Examples 15 through 18, wherein the first gate electrode includes a third layer having first and second non-contiguous portions, the first non-contiguous portion between the first layer and a first portion of the high-k gate dielectric, and the second non-contiguous portion between the first layer and a second portion of the high-k gate dielectric, and wherein the third layer is not between the first layer and a third portion of the high-k gate dielectric.

Example 20 includes the subject matter of Example 19, wherein the third layer has a thickness in the range of 2 to 10 angstroms.

Example 21 includes the subject matter of Example 19 or 20, wherein the third layer comprises titanium and nitrogen.

Example 22 includes the subject matter of any one of Examples 15 through 21, wherein the first gate electrode is an n-type metal oxide semiconductor (NMOS) gate electrode, and the second gate electrode is a p-type metal oxide semiconductor (PMOS) gate electrode.

Example 23 includes the subject matter of any one of Examples 15 through 21, and further includes: a first source region and a first drain region, each adjacent to the first nanoribbon; and a second source region and a second drain region, each adjacent to the second nanoribbon; wherein the first source and drain regions comprise an n-type dopant, and the second source and drain regions comprise a p-type dopant.

Example 24 includes the subject matter of any one of Examples 15 through 23, wherein the compound of the first gate electrode is a silicide, and the second gate electrode is silicide-free.

Example 25 includes the subject matter of any one of Examples 15 through 24, wherein the first nanoribbon is adjacent a third nanoribbon, and the first gate structure is around the first and third nanoribbons, and wherein the first layer merges between the first and third nanoribbons such that the second layer is not between the first and third nanoribbons.

Example 26 is a processor or memory comprising the integrated circuit of any one of Examples 1 through 14, or the integrated circuit structure of any one of Examples 15 through 25.

Example 27 is an electronic system comprising the integrated circuit of any one of Examples 1 through 14, or the integrated circuit structure of any one of Examples 15 through 25, or the processor or memory of Example 26.

Example 28 is an integrated circuit, comprising: a dielectric body; a first semiconductor body laterally extending from a first side of the dielectric body; a second semiconductor body laterally extending from a second side of the dielectric body; a first gate structure on the first semiconductor body, the first gate structure including a first gate electrode and a first high-k gate dielectric between the first gate electrode and the first semiconductor body, the first gate electrode including a layer comprising a compound of silicon and one or more metals; and a second gate structure on the second semiconductor body, the second gate structure including a second gate electrode and a second high-k gate dielectric between the second gate electrode and the second semiconductor body. The dielectric body along with the first and second semiconductor bodies and first and second gate structures may be part of, for example, a forksheet transistor structure. The structure may further include source and drain regions.

Example 29 includes the subject matter of Example 28, wherein the one or more metals of the compound are one or more first metals, and the first gate electrode further includes one or more second metals, wherein at least a portion of the one or more second metals is between first and second portions of the compound.

Example 30 includes the subject matter of Example 29, wherein the one or more first metals include titanium or tantalum, and the one or more second metals include cobalt or tungsten.

Example 31 includes the subject matter of Example 29 or 30, wherein the compound is a bi-metallic silicide, such that at least a portion of the one or more second metals is between first and second portions of the bi-metallic silicide. In some examples, note the compound may include multiple bond configurations and/or phases, such as a first phase that include silicon and the first metal, and a second phase that includes silicon and the second metal but not the first metal, or a first phase that includes a first stoichiometry or bonding configuration and a second phase that includes a second stoichiometry or bonding configuration.

Example 32 includes the subject matter of any one of Examples 28 through 31, wherein each of the first high-k gate dielectric and the second high-k gate dielectric have a thickness in the range of 5 to 25 angstroms, and wherein the layer comprising the compound has a thickness in the range of 20 to 100 angstroms.

Example 33 includes the subject matter of any one of Examples 28 through 31, wherein the first gate electrode is an n-type metal oxide semiconductor (NMOS) gate electrode, and the second gate electrode is a p-type metal oxide semiconductor (PMOS) gate electrode.

Example 34 is a method of forming an integrated circuit structure including a stacked transistor architecture, the method comprising: removing dummy gate material to expose a lower channel region of the stacked transistor architecture; forming a first gate dielectric on the lower channel region; forming a first gate electrode on the first gate dielectric, by depositing one or more layers, each layer including silicon and/or a metal, annealing the one or more layers to form a silicide workfunction layer, and depositing gate fill metal on the silicide workfunction layer; forming an upper portion of the stacked architecture, the upper portion including a dummy gate structure over an upper channel region that is above the lower channel region, the upper portion further including epitaxial source and drain regions adjacent to the upper channel region; removing dummy gate material to expose the upper channel region; forming a second gate dielectric on the upper channel region; and forming a second gate electrode on the second gate dielectric, by forming a p-type workfunction layer, and depositing gate fill on the p-type workfunction layer.

Example 35 includes the subject matter of Example 34, and further includes: releasing, via a selective etch process and prior to forming the first gate dielectric, a first nanoribbon of the lower channel region, wherein the first gate dielectric and first gate electrode wrap around the first nanoribbon; and releasing, via a selective etch process and prior to forming the second gate dielectric, a second nanoribbon of the upper channel region, wherein the second gate dielectric and second gate electrode wrap around the second nanoribbon.

Example 36 includes the subject matter of Example 34 or 35, and further includes: forming a first source region and a first drain region, each adjacent to the lower channel region; and forming, after the first gate electrode is formed, a second source region and a second drain region, each adjacent to the upper channel region; wherein the first source and drain regions comprise an n-type dopant, and the second source and drain regions comprise a p-type dopant.

Example 37 includes the subject matter of any one of Examples 34 through 36, wherein depositing the one or more layers of the first gate electrode includes depositing a first layer comprising silicon and then depositing a second layer comprising a metal, and the annealing of the first and second layers causes the silicide workfunction layer to form.

Example 38 includes the subject matter of any one of Examples 34 through 37, wherein depositing the one or more layers of the first gate electrode includes depositing a layer comprising silicon and a metal, and the annealing of the layer causes the silicide workfunction layer to form.

Example 39 includes the subject matter of any one of Examples 34 through 38, wherein forming the first gate electrode on the first gate dielectric further includes: depositing, after forming the first gate dielectric and prior to depositing the one or more layers, a nucleation layer, wherein depositing the nucleation layer includes removing portions of the nucleation layer on horizontal surfaces using a directional etch, such that the nucleation layer has first and second non-contiguous portions.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
a first semiconductor body;
a second semiconductor body above the first semiconductor body, wherein the first and second semiconductor bodies are separated from one another by insulator material;
a first gate structure on the first semiconductor body, the first gate structure including a first gate electrode and a first high-k gate dielectric between the first gate electrode and the first semiconductor body, the first gate electrode including a first conductive layer, a second conductive layer, and a conductive fill, wherein the first conductive layer comprises a compound of silicon and one or more first metals, and wherein the conductive fill comprises one or more second metals different from the one or more first metals and is directly on a topmost surface of the first conductive layer, and wherein the second conductive layer includes first and second non-contiguous portions, the first non-contiguous portion directly contacting both the first conductive layer and a first sidewall portion of the first high-k gate dielectric, and the second non-contiguous portion directly contacting both the first conductive layer and a second sidewall portion of the first high-k gate dielectric that is opposite from the first sidewall portion; and
a second gate structure on the second semiconductor body, the second gate structure including a second gate electrode and a second high-k gate dielectric between the second gate electrode and the second semiconductor body.

2. The integrated circuit structure of claim 1, wherein at least a portion of the one or more second metals is between first and second portions of the compound.

3. The integrated circuit of claim 1, wherein the one or more first metals include titanium or tantalum, and the one or more second metals include cobalt or tungsten.

4. The integrated circuit of claim 1, wherein the compound is a bi-metallic silicide, and at least a portion of the one or more second metals is between first and second portions of the bi-metallic silicide.

5. The integrated circuit of claim 1, wherein each of the first high-k gate dielectric and the second high-k gate dielectric have a thickness in the range of 5 to 25 angstroms, and wherein the first conductive layer comprising the compound has a thickness in the range of 20 to 100 angstroms.

6. The integrated circuit of claim 1, wherein the second conductive layer is not between the first conductive layer and a bottom portion of the first high-k gate dielectric.

7. The integrated circuit of claim 1, wherein the second conductive layer has a thickness in the range of 2 to 10 angstroms.

8. The integrated circuit of claim 7, wherein the second conductive layer comprises titanium and nitrogen.

9. The integrated circuit of claim 1, wherein the first gate electrode is an n-type metal oxide semiconductor (NMOS) gate electrode, and the second gate electrode is a p-type metal oxide semiconductor (PMOS) gate electrode.

10. The integrated circuit of claim 1, wherein the first semiconductor body includes a first nanoribbon, and the first gate structure wraps around the nanoribbon, and wherein the second semiconductor body includes a second nanoribbon, and the second gate structure wraps around the second nanoribbon.

11. The integrated circuit of claim 1, comprising:
a first source region and a first drain region, each adjacent to the first semiconductor body; and
a second source region and a second drain region, each adjacent to the second semiconductor body;
wherein the first source and drain regions comprise an n-type dopant, and the second source and drain regions comprise a p-type dopant.

12. The integrated circuit of claim 1, wherein the compound of the first gate electrode is a silicide, and the second gate electrode is silicide-free.

13. An integrated circuit structure, comprising:
a first nanoribbon;
a second nanoribbon above the first nanoribbon, wherein the first and second nanoribbons are separated from one another by insulator material;
a first gate structure around the first nanoribbon, the first gate structure including a first gate electrode and a first high-k gate dielectric between the first gate electrode and the first nanoribbon, the first gate electrode including a first conductive layer, a second conductive layer, and a third conductive layer, the first conductive layer comprising a compound of silicon and one or more first metals, and the second conductive layer comprising one or more second metals, wherein a topmost surface of the first conductive layer is lower than a topmost surface of the second conductive layer, such that the second conductive layer extends over and contacts the topmost surface of the first conductive layer, and wherein the third conductive layer includes first and second non-contiguous portions, the first non-contiguous portion directly contacting both the first conductive layer and a first sidewall portion of the first high-k gate dielectric, and the second non-contiguous portion directly contacting both the first conductive layer and a second sidewall portion of the first high-k gate dielectric that is opposite from the first sidewall portion; and
a second gate structure around the second nanoribbon, the second gate structure including a second gate electrode and a second high-k gate dielectric between the second gate electrode and the second nanoribbon.

14. The integrated circuit structure of claim 13, wherein the one or more first metals include titanium or tantalum, and the one or more second metals include cobalt or tungsten.

15. The integrated circuit structure of claim 13, wherein the compound is a single metal silicide that includes one metal, or a bi-metallic silicide that includes first and second metals.

16. The integrated circuit structure of claim 13, comprising:

a first source region and a first drain region, each adjacent to the first nanoribbon; and a second source region and a second drain region, each adjacent to the second nanoribbon;

wherein the first source and drain regions comprise an n-type dopant, and the second source and drain regions comprise a p-type dopant.

17. The integrated circuit structure of claim 13, wherein each of the first high-k gate dielectric and the second high-k gate dielectric have a thickness in the range of 5 to 25 angstroms, and wherein the first conductive layer has a thickness in the range of 20 to 100 angstroms.

18. The integrated circuit structure of claim 13, wherein the third conductive layer is not between the first gate electrode and a bottom portion of the first high-k gate dielectric.

19. An integrated circuit, comprising:

a first semiconductor body;

a second semiconductor body above the first semiconductor body, wherein the first and second semiconductor bodies are separated from one another by insulator material;

a first gate structure on the first semiconductor body, the first gate structure including a first gate electrode and a first high-k gate dielectric between the first gate electrode and the first semiconductor body, the first gate electrode including a first conductive layer, a second conductive layer, and a conductive fill, wherein the first conductive layer comprises a compound of silicon and one or more first metals, and wherein the conductive fill is on the first conductive layer and comprises one or more second metals different from the one or more first metals, and wherein the second conductive layer includes first and second non-contiguous portions, the first non-contiguous portion directly contacting both the first conductive layer and a first sidewall portion of the first high-k gate dielectric, and the second non-contiguous portion directly contacting both the first conductive layer and a second sidewall portion of the first high-k gate dielectric that is opposite from the first sidewall portion; and a second gate structure on the second semiconductor body, the second gate structure including a second gate electrode and a second high-k gate dielectric between the second gate electrode and the second semiconductor body.

20. The integrated circuit of claim 19, wherein the compound of the first gate electrode is a silicide, and the second gate electrode is silicide-free.

* * * * *